United States Patent
Freer et al.

(10) Patent No.: US 10,863,638 B2
(45) Date of Patent: Dec. 8, 2020

(54) MOISTURE CONTROL SYSTEMS FOR ENCLOSURES

(71) Applicant: EATON INTELLIGENT POWER LIMITED, Dublin (IE)

(72) Inventors: Benjamin Avery Freer, Syracuse, NY (US); Jesse Wade Taylor, Baldwinsville, NY (US); Andrew Francis Scarlata, West Monroe, NY (US); Joseph Michael Manahan, Manlius, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 689 days.

(21) Appl. No.: 15/603,595

(22) Filed: May 24, 2017

(65) Prior Publication Data

US 2017/0347473 A1 Nov. 30, 2017

Related U.S. Application Data

(60) Provisional application No. 62/340,621, filed on May 24, 2016.

(51) Int. Cl.
| | |
|---|---|
| *B01D 53/02* | (2006.01) |
| *H05K 5/02* | (2006.01) |
| *B01D 53/26* | (2006.01) |
| *B01D 53/04* | (2006.01) |
| *H02G 3/08* | (2006.01) |
| *H02B 1/28* | (2006.01) |

(52) U.S. Cl.
CPC ....... *H05K 5/0213* (2013.01); *B01D 53/0454* (2013.01); *B01D 53/261* (2013.01); *B01D 2257/80* (2013.01); *B01D 2259/40096* (2013.01); *H02B 1/28* (2013.01); *H02G 3/088* (2013.01)

(58) Field of Classification Search
CPC ...... B01D 2257/80; B01D 2259/40096; B01D 53/261; H02B 1/28; H02G 3/088; H05K 5/0213
See application file for complete search history.

(56) References Cited

U.S. PATENT DOCUMENTS

| | | | | |
|---|---|---|---|---|
| 4,546,442 A | * | 10/1985 | Tinker | B01D 53/0454 700/266 |
| 5,110,327 A | * | 5/1992 | Smith | B60T 17/004 95/122 |

(Continued)

*Primary Examiner* — Christopher P Jones
(74) *Attorney, Agent, or Firm* — Pearne & Gordon LLP

(57) ABSTRACT

An enclosure system can include an enclosure comprising at least one wall forming a first cavity. The enclosure system can further include a moisture control system in communication with the enclosure, wherein the moisture control system controls at least one condition within the cavity of the enclosure, where the at least one condition affects an amount of moisture within the first cavity. The moisture control system can include a sensor that measures an amount of moisture in desiccant disposed within a desiccant vessel. The moisture control system can include a structural filter and a desiccant vessel, where the structural filter is coupled to an enclosure and disposed within a cavity formed by the enclosure, where the desiccant vessel is removably coupled to the structural filter, and where the desiccant vessel is accessible from outside the enclosure.

18 Claims, 11 Drawing Sheets

(56) References Cited

U.S. PATENT DOCUMENTS

| | | | | |
|---|---|---|---|---|
| 6,537,353 B2* | 3/2003 | Holst | .................... | B01D 53/04 423/210 |
| 2002/0116933 A1* | 8/2002 | Chu | .................... | H05K 5/0213 62/93 |
| 2002/0134246 A1* | 9/2002 | Babicki | .............. | B01D 53/0423 96/125 |
| 2004/0025532 A1* | 2/2004 | Scaringe | ............... | F25B 43/003 62/474 |
| 2005/0103195 A1* | 5/2005 | Golner | ............... | B01D 53/0415 96/111 |
| 2013/0258598 A1* | 10/2013 | Millner | ................ | H05K 5/0213 361/704 |
| 2013/0319032 A1* | 12/2013 | Ball | .................... | B01D 53/263 62/271 |

* cited by examiner

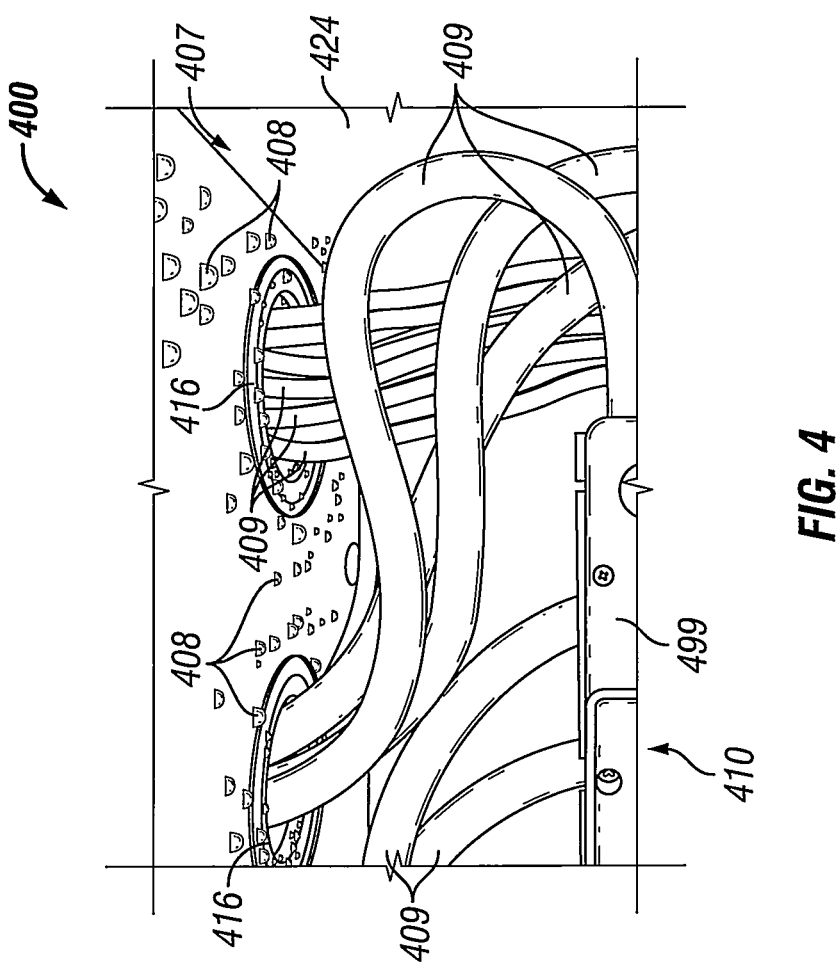
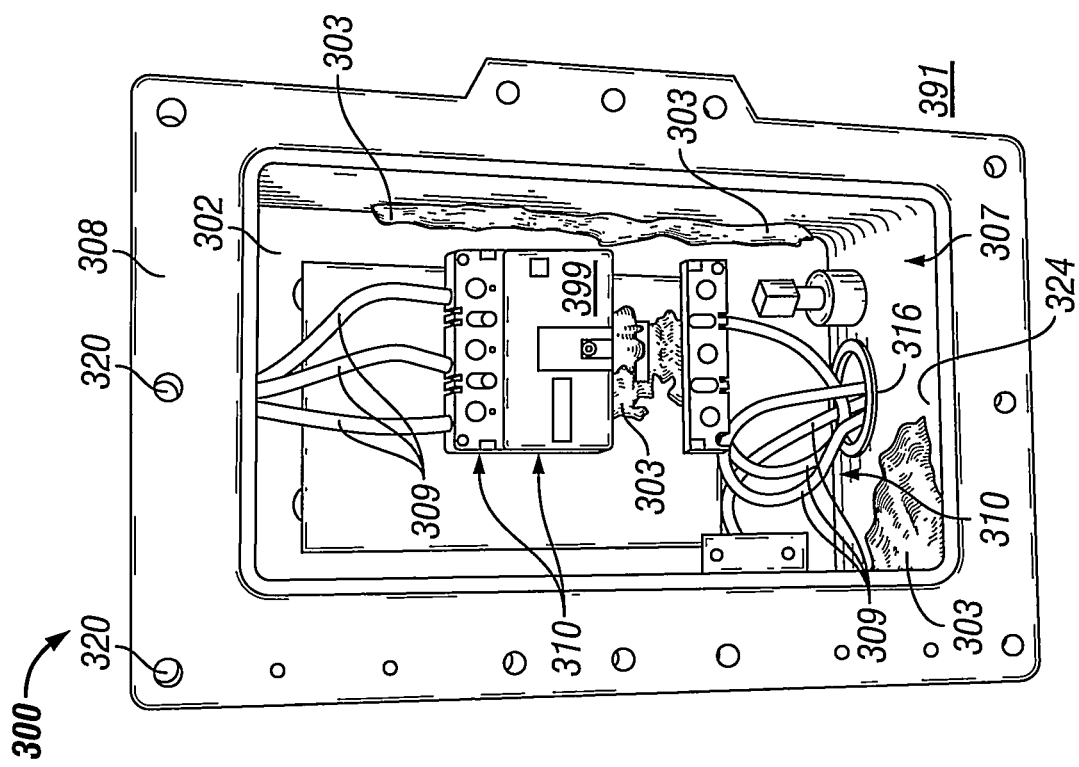

MOISTURE CONTROL SYSTEMS FOR ENCLOSURES

CROSS-REFERENCE TO RELATED APPLICATIONS

This application claims priority under 35 U.S.C. § 119 to U.S. Provisional Patent Application Ser. No. 62/340,621, titled "Moisture Control Systems For Enclosures" and filed on May 24, 2016, the entire contents of which are hereby incorporated herein by reference.

TECHNICAL FIELD

The present disclosure relates generally to controlling an environment within enclosures, and more particularly to systems, methods, and devices for moisture control systems for enclosures.

BACKGROUND

Enclosures are used in a number of applications and have a number of different sizes and configurations. Such enclosures have one or more electrical devices and/or mechanical devices disposed therein. One or more of the mechanical devices can operate based on a change of state of an electrical device. Sometimes, the environments in which these enclosures are located are subject to one or more environmental conditions (e.g., high temperatures, high humidity, moisture) that can be present inside an enclosure. When this occurs, damage can occur to the electrical devices, causing the electrical devices to fail and creating a potential safety concern. Similarly, if a mechanical device corrodes or otherwise fails because of unfavorable environmental conditions within the enclosure, the mechanical device may fail to operate when an electrical device changes state, which can also create a safety concern. In addition, the interior surfaces of the enclosure can become corroded or otherwise damaged.

SUMMARY

In general, in one aspect, the disclosure relates to an enclosure system that can include an enclosure having at least one wall forming a first cavity. The enclosure system can also include a moisture control system in communication with the enclosure, where the moisture control system controls at least one condition within the cavity of the enclosure, where the at least one condition affects an amount of moisture within the first cavity.

In another aspect, the disclosure can generally relate to an enclosure system that can include an enclosure having at least one wall forming a cavity. The enclosure system can also include a moisture control system in communication with the enclosure. The moisture control system can include a moisture control device disposed, at least in part, within the cavity of the enclosure. The moisture control system can also include a sensor that measures a parameter associated with an effectiveness of the moisture control device. The moisture control system can further include a controller that receives measurements made by the sensor and determines whether the effectiveness of the moisture control device has been compromised based on the measurements.

In yet another aspect, the disclosure can generally relate to an enclosure system that can include an enclosure comprising at least one wall forming a first cavity. The enclosure system can also include at least one moisture control system in communication with the enclosure. The at least one moisture control system can include a structural filter defining a portion of the first cavity of the enclosure, where the structural filter traverses at least part of an aperture that traverses the at least one wall of the enclosure. The at least one moisture control system can also include a desiccant vessel that is removably coupled to the structural filter, where the desiccant vessel is accessible by a user from outside the enclosure.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

FIGS. 3 and 4 show enclosures that show the effects on electrical components that are exposed to moisture.

DETAILED DESCRIPTION

Figure 1:
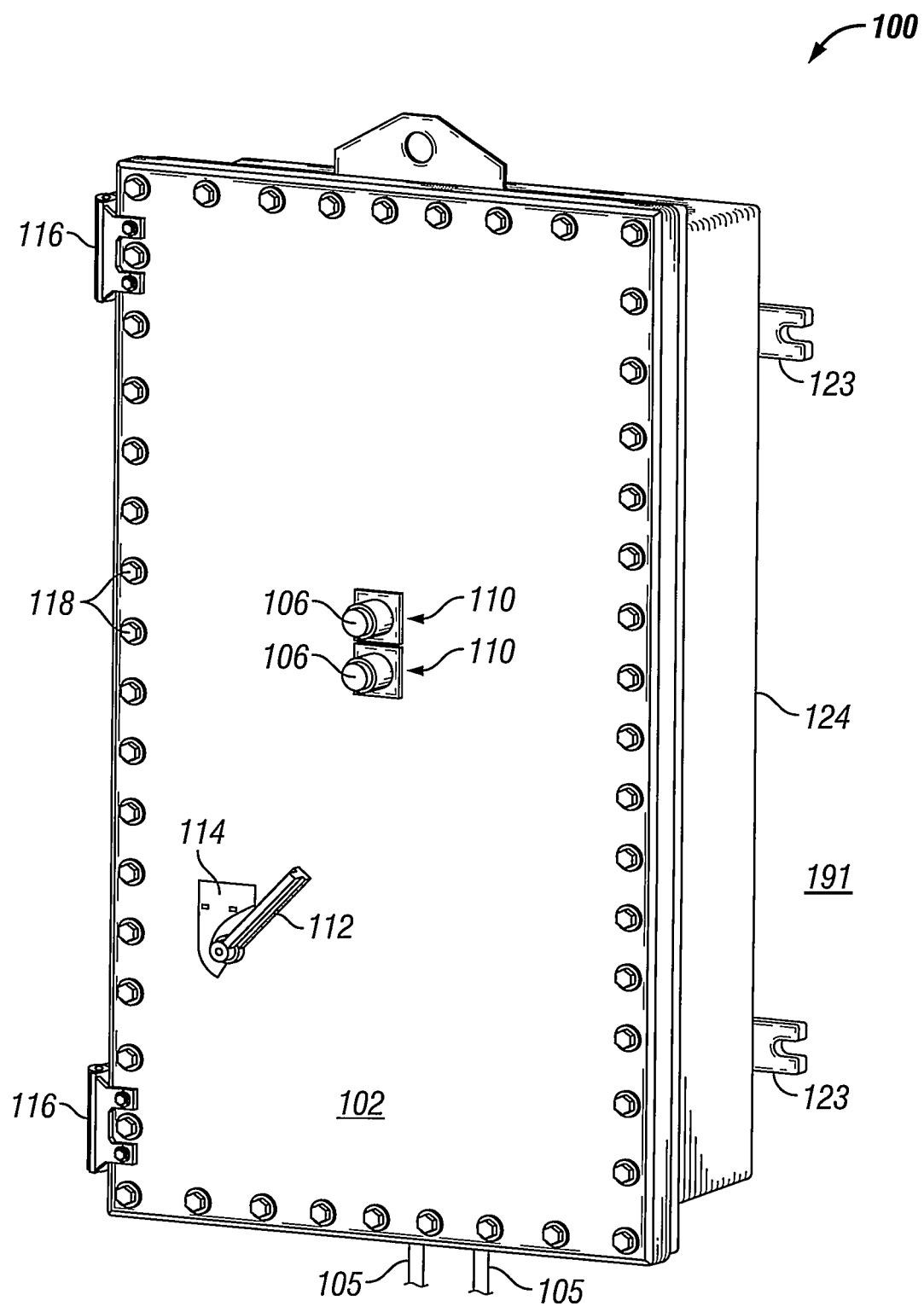
FIG. 1 shows a front perspective view of the exterior of an explosion-proof enclosure in which one or more example embodiments can be implemented.

In general, example embodiments provide systems, methods, and devices for moisture control systems for enclosures. While many of the example moisture control systems described herein are directed for use with enclosures designed to be located in hazardous (e.g., explosive) environments, such embodiments can be used with enclosures that are designed for use in other environments that are not considered hazardous. A user may be any person that interacts with example moisture control systems for enclosures.

Examples of a user may include, but are not limited to, an engineer, an electrician, an instrumentation and controls technician, a mechanic, an operator, a consultant, a contractor, and a manufacturer's representative.

Condensation and moisture accumulation are the primary cause of maintenance of equipment (e.g., electrical devices, mechanical devices) located in high humidity environments. While enclosures, which house electrical devices and/or mechanical devices (called enclosure devices herein), offer some degree of protection for and isolation of those devices, problems related to condensation and moisture can still occur within the cavities of enclosures. While example embodiments are directed to controlling moisture within an enclosure, example embodiments can also control one or more conditions (also called environmental conditions) within an enclosure. Such other conditions can include, but are not limited to, temperature, pressure, humidity, and air quality.

In the current art, breathers or drains are disposed in a wall of an enclosure in an attempt to remove condensation and moisture that accumulates in the enclosure. The best performing breathers and drains currently available perform at a flow rate of approximately 22 cc/min (1.52 in$^3$/min). When the enclosure is explosion-proof, the breathers and drains act as explosion-proof weep holes that rely on head pressure within the enclosure to vent. These breathers and drains are largely ineffective, especially in hazardous locations. A major problem with these breathers and drains is dirt, insects, and other debris often clog the breathers and drains, preventing condensation and moisture from escaping the enclosure. In order to free the breathers and drains of debris, frequent maintenance must be performed on the breathers and drains. Realistically, the high degree of maintenance required to keep the breathers and drains free of debris is impractical and occurs infrequently.

Also in the current art, desiccants and heaters are used in enclosures in an attempt to control condensation and moisture. While a desiccant can be effective, it must be frequently replaced. In addition, a desiccant often is stored in packages, and when these packages fail over time, the desiccant spills into the enclosure, which can block drains and/or cause other problems within the enclosure. As stated above, from a practical standpoint, this degree of maintenance is too burdensome, and so the desiccant is not replaced often enough to be an effective means of controlling condensation and moisture in an enclosure. While heaters disposed in the cavity of an enclosure can be used to effectively raise the dew point (thus reducing the level of moisture and condensation) in the enclosure, the heat generated by the heaters can diminish the performance and life of enclosure devices in the cavity of the enclosure because of the elevated temperature that those enclosure devices are exposed to within the cavity.

The moisture control systems for enclosures described herein can be used in place of, or in addition to, devices and/or systems currently used in the art. The moisture control systems for enclosures (or components thereof) described herein can be made of one or more of a number of suitable materials to allow the enclosures to meet certain standards and/or regulations while also maintaining durability in light of the one or more conditions under which the enclosures, including the example moisture control systems, can be exposed. Examples of such materials can include, but are not limited to, aluminum, stainless steel, fiberglass, glass, plastic, ceramic, and rubber.

Example moisture control systems for enclosures, or portions thereof, described herein can be made from multiple pieces that are mechanically coupled to each other. In such a case, the multiple pieces can be mechanically coupled to each other using one or more of a number of coupling methods, including but not limited to epoxy, welding, fastening devices, compression fittings, mating threads, and slotted fittings. One or more pieces that are mechanically coupled to each other can be coupled to each other in one or more of a number of ways, including but not limited to fixedly, hingedly, removeably, slidably, and threadably.

Components and/or features described herein can include elements that are described as coupling, mounting, fastening, securing, or other similar terms. Such terms are merely meant to distinguish various elements and/or features within a component or device and are not meant to limit the capability or function of that particular element and/or feature. For example, a feature described as a "coupling feature" can couple, mount, secure, fasten, abut against, and/or perform other functions aside from merely coupling.

A coupling feature (including a complementary coupling feature) as described herein can allow one or more components and/or portions of an example moisture control system (e.g., a bushing, a structural filter, a breather) to become mechanically coupled, directly or indirectly, to another portion of the moisture control system. A coupling feature can include, but is not limited to, a portion of a hinge, an aperture, a recessed area, a protrusion, a clamp, a slot, a spring clip, a tab, a detent, and mating threads. One portion of an example moisture control system can be coupled to a component of the moisture control system by the direct use of one or more coupling features.

In addition, or in the alternative, a portion of an example moisture control system can be coupled to a component of a moisture control system using one or more independent devices that interact with one or more coupling features disposed on a component of the moisture control system. Examples of such devices can include, but are not limited to, a pin, a hinge, a fastening device (e.g., a bolt, a screw, a rivet), a clamp, and a spring. One coupling feature described herein can be the same as, or different than, one or more other coupling features described herein. A complementary coupling feature as described herein can be a coupling feature that mechanically couples, directly or indirectly, with another coupling feature.

Further, if a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three or four digit number and corresponding components in other figures have the identical last two digits.

In the foregoing figures showing example embodiments of moisture control systems for enclosures, one or more of the components shown may be omitted, repeated, and/or substituted. Accordingly, example embodiments of moisture control systems for enclosures should not be considered limited to the specific arrangements of components shown in any of the figures. For example, features shown in one or more figures or described with respect to one embodiment can be applied to another embodiment associated with a different figure or description. As a specific example, a sensor device (also called a sensor herein) can be used in an example embodiment described below, even though no sensor device is shown or described for that particular embodiment. Further, any description of a figure or embodiment made herein stating that one or more components are not included in the figure or embodiment does not mean that such one or more components could not be included in the figure or embodiment, and that for the purposes of the claims set forth herein, such one or more components can be included in one or more claims directed to such figure or embodiment.

As defined herein, an enclosure is any type of cabinet or housing inside of which is disposed one or more enclosure devices. Such enclosure devices can include, but are not limited to, variable frequency drives (VFDs), controllers, relays (e.g., solid state, electro-mechanical), contactors, breakers, switches, transformers, inverters, converters, fuses, electrical cables, thermo-electric coolers (TECs), heating elements, air moving devices (e.g., fans, blowers), terminal blocks, wire nuts, and electrical conductors. In some cases, an enclosure device can generate heat when operating. Enclosure devices can also include mechanical components and/or mechanical devices that are controlled by another enclosure device. Examples of an enclosure can include, but are not limited to, an electrical connector, a junction box, a motor control center, a breaker cabinet, an electrical housing, a conduit, a control panel, an electrical receptacle, a lighting panel, a lighting device, a relay cabinet, an indicating panel, and a control cabinet. An electrical cable as defined herein can be one or more electrical conductors that carry power (e.g., current) from one end to another. An electrical cable can be jacketed with an electrically non-conductive material (e.g., rubber).

Example embodiments are designed to control an amount of moisture within an enclosure. Certain example embodiments can be used to keep the moisture (as measured, for example, by relative humidity using sensors within and/or outside the enclosure) that is within an enclosure within a range of values or below a maximum value. In some cases, example embodiments can be used to eliminate substantially all moisture within an enclosure. As such, example embodiments can operate continuously, at regular intervals, when the moisture within an enclosure falls outside a range of values, on-demand from a user, and/or according to some other schedule.

In certain example embodiments, enclosures to which example moisture control systems are coupled are subject to meeting certain standards and/or requirements. For example, the National Electric Code (NEC), the National Electrical Manufacturers Association (NEMA), the International Electrotechnical Commission (IEC), and the Institute of Electrical and Electronics Engineers (IEEE) set standards as to enclosures, wiring, and electrical connections. Use of example embodiments described herein meet (and/or allow a corresponding device to meet) such standards when required. In some (e.g., PV solar) applications, additional standards particular to that application may be met by the enclosures to which example moisture control systems are coupled.

For example, the example moisture control systems, when coupled to an enclosure, can allow the enclosure to meet the NEMA 4x standard. In such a case, the enclosure is constructed to provide a degree of protection to components (e.g., enclosure devices) disposed within the enclosure against, at least, corrosion, falling dirt, rain, sleet, snow, ice, windblown dust, splashing water, and hose-directed water. As a specific example, an enclosure with a NEMA 4x rating can provide protection with respect to harmful effects on electrical equipment disposed within the enclosure due to ingress of water. Thus, the example moisture control system that is mechanically coupled to such an enclosure must also meet these standards.

An enclosure that includes an example moisture control system can be located in any type of environment (e.g., indoors, outdoors, under water, in a climate controlled room). In addition, or in the alternative, example moisture control systems can be located in hazardous and/or marine environments. As defined herein, a hazardous location is any location where the enclosure can be exposed to extreme conditions. Extreme conditions can include, but are not limited to, high temperatures, low temperatures, temperature fluctuations, corrosion, humidity, chemicals, vibrations, and dust. More information about hazardous locations and hazardous location enclosures can be found, for example, in Articles 500-506 and Articles 510-517 of the National Electric Code, which is incorporated herein by reference.

Examples of a hazardous location in which example embodiments can be used can include, but are not limited to, an airplane hangar, a drilling rig (as for oil, gas, or water), a production rig (as for oil or gas), a refinery, a chemical plant, a power plant, a mining operation, and a steel mill. A hazardous environment can include an explosion-proof environment, which would require an enclosure with an example moisture control system to meet one or more requirements, including but not limited to flame paths.

An explosion-proof enclosure is a type of hazardous location enclosure. In one or more example embodiments, an explosion-proof enclosure (also known as a flame-proof enclosure) is an enclosure that is configured to contain an explosion that originates inside the enclosure. Further, the explosion-proof enclosure is configured to allow gases from inside the enclosure to escape across joints of the enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface.

In one or more example embodiments, an explosion-proof enclosure is subject to meeting certain standards and/or requirements. For example, NEMA sets standards with which an enclosure must comply in order to qualify as an explosion-proof enclosure. Specifically, NEMA Type 7, Type 8, Type 9, and Type 10 enclosures set standards with which an explosion-proof enclosure within certain hazardous locations must comply. For example, a NEMA Type 7 standard applies to enclosures constructed for indoor use in certain hazardous locations. Hazardous locations may be defined by one or more of a number of authorities, including but not limited to the National Electric Code (e.g., Class 1, Division I) and UL (e.g., UL 1203). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes (e.g., greater than 100 $in^3$) may require that in a Group B, Division 1 area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

Example embodiments of moisture control systems for enclosures will be described more fully hereinafter with reference to the accompanying drawings, in which example embodiments of moisture control systems for enclosures are shown. Moisture control systems for enclosures may, however, be embodied in many different forms and should not be construed as limited to the example embodiments set forth herein. Rather, these example embodiments are provided so that this disclosure will be thorough and complete, and will fully convey the scope of moisture control systems for enclosures to those of ordinary skill in the art. Like, but not necessarily the same, elements (also sometimes called components) in the various figures are denoted by like reference numerals for consistency.

Terms such as "first", "second", "top", "bottom", "side", "width", "length", "inner", and "outer are used merely to distinguish one component (or part of a component or state of a component) from another. Such terms are not meant to denote a preference or a particular orientation, and are not meant to limit embodiments of moisture control systems for enclosures. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows a front perspective view of the exterior of an example explosion-proof enclosure 100 in which one or more example embodiments can be implemented. Referring now to FIG. 1, the example of an explosion-proof enclosure 100 in a closed position (i.e., the enclosure cover 102 is secured to the enclosure body 124) is shown in an ambient environment 191 (e.g., a hazardous environment). The enclosure cover 102 can be secured to the enclosure body 124 by a number of fastening devices 118 located at a number of points around the perimeter of the enclosure cover 102. In one or more example embodiments, a fastening device 118 may be one or more of a number of fastening devices, including but not limited to a bolt (which may be coupled with a nut), a screw (which may be coupled with a nut), and a clamp. In addition, one or more optional hinges 117 can be secured to one side of the enclosure cover 102 and a corresponding side of the enclosure body 124 so that, when all of the fastening devices 118 are removed, the enclosure cover 102 may swing outward (i.e., an open position) from the enclosure body 124 using the one or more hinges 117. In one or more example embodiments, there are no hinges, and the enclosure cover 102 can be completely separated from the enclosure body 124 when all of the fastening devices 118 are removed.

The enclosure cover 102 and the enclosure body 124 may be made of any suitable material, including metal (e.g., alloy, stainless steel), plastic, some other material, or any combination thereof. The enclosure cover 102 and the enclosure body 124 may be made of the same material or different materials. In one or more example embodiments, on the end of the enclosure body 124 opposite the enclosure cover 102, one or more mounting brackets 123 are affixed to the exterior of the enclosure body 124 to facilitate mounting the enclosure 100. Using the mounting brackets 123, the enclosure 100 may be mounted to one or more of a number of surfaces and/or elements, including but not limited to a wall, a control cabinet, a cement block, an I-beam, and a U-bracket.

The enclosure cover 102 can optionally include one or more features that allow for user interaction while the enclosure 100 is sealed in the closed position. As shown in FIG. 1, one or more enclosure devices 110 (e.g., indicating lights 106, switch handle 112) may be located on the enclosure cover 102. The enclosure cover 102 may also include a switch handle 112 (a type of mechanical device, which can be considered an enclosure device 110) that allows a user to operate a switch (shown in FIG. 2 below) located inside the explosion-proof enclosure 100 while the explosion-proof enclosure 100 is closed. Each position (e.g., OFF, ON, HOLD, RESET) of the switch may be indicated by a switch position indicator 114 positioned adjacent to the switch handle 112 on the outer surface of the enclosure cover 102. A switch associated with the switch handle 112 and the switch position indicator 114 may be used to electrically and/or mechanically isolate, and/or change the mode of operation of, one or more components inside or associated with the explosion-proof enclosure 100.

There can be one or more conduits 105 that are coupled to a wall 124 of the explosion-proof enclosure 100. Each conduit 105 can have one or more electrical conductors (e.g., electrical cables) disposed therein, where one end of the electrical conductors are electrically coupled to one or more enclosure devices 110 disposed within the explosion-proof enclosure 100, as shown below with respect to FIG. 2.

Figure 2:
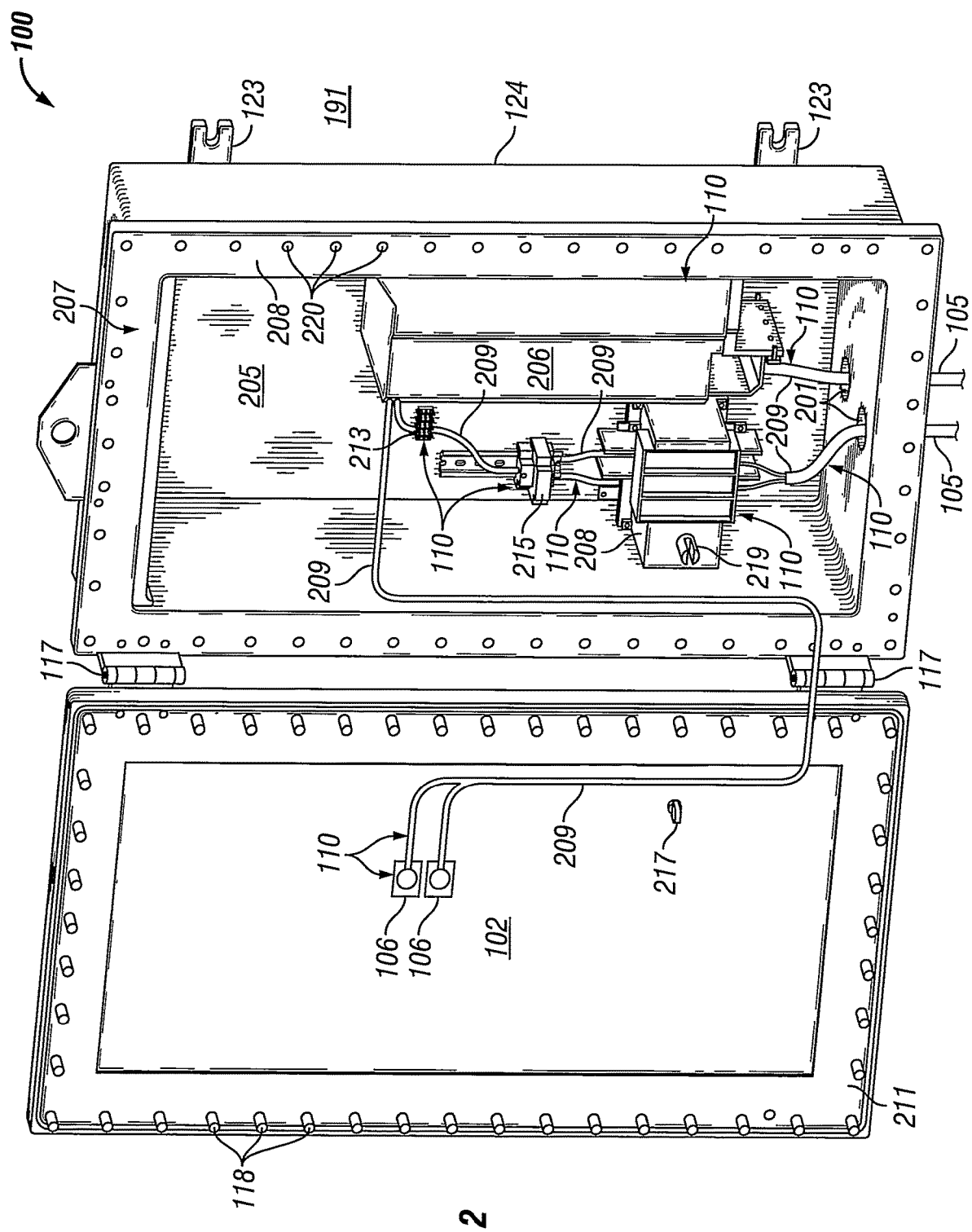
FIG. 2 shows a front perspective view of the interior of an explosion-proof enclosure in which one or more example embodiments can be implemented.

FIG. 2 shows a front perspective view of an example of the interior of the explosion-proof enclosure 100 of FIG. 1 in which one or more example embodiments can be implemented. Referring to FIGS. 1 and 2, the explosion-proof enclosure 100 is in the open position because the enclosure cover 102 is not secured to the enclosure body 124. The hinges 117 attached to the left side of the enclosure body 124 are also attached to the left side of the enclosure cover 102, which is swung outward from the enclosure body 124. Because the explosion-proof enclosure 100 is in the open position, the components of the explosion-proof enclosure 100 are visible to a user.

As described above with respect to FIG. 1, the enclosure body 124 includes two or more mounting brackets 123. In addition, in one or more example embodiments, the enclosure body 124 includes an enclosure engagement surface 208 (also called a flange), against which an enclosure engagement surface 211 (also called a flange) of the enclosure cover 102 abuts against when the explosion-proof enclosure 100 is in the closed position. A number of coupling features 220 (in this case, apertures) are shown around the enclosure engagement surface 208, where each of the coupling features 220 are configured to receive a coupling feature 118 (in this case, a fastening device, such as a bolt) that traverses through corresponding coupling features (e.g., apertures) in the enclosure cover 102.

In one or more example embodiments, the explosion-proof enclosure 100 of FIG. 2 includes a mounting plate 205 that is affixed to the back of the inside of the explosion-proof enclosure 100. The mounting plate 205 may be configured to receive one or more components (e.g., enclosure devices 110) such that the one or more components are affixed to the mounting plate 205. The mounting plate 205 may include one or more apertures configured to receive coupling features (e.g., bolts) that may be used to affix a component to the mounting plate 205. The mounting plate 205 may be made of any suitable material, including but not limited to the material of the enclosure body 124. In one or more example embodiments, some or all of the one or more components may be mounted directly to an inside wall of the explosion-proof enclosure 100 rather than to the mounting plate 205.

In this case, the enclosure devices 110 mounted to the mounting plate 205 within the cavity 207 of the explosion-proof enclosure 100 include a VFD 206, a switch 208, a relay 212, and a terminal block 214. The switch 208 can include a switch coupling 219 that couples to a switch handle shaft 217 that extends from the switch handle 112 when the explosion-proof enclosure is in the closed position. Electrical conductors 100 are used to electrically couple one enclosure device 110 to at least one other enclosure device 110 within the cavity 207 of the explosion-proof enclosure 100. Each conduit 105 is disposed within an entry hole 216 disposed in the bottom wall of the enclosure body 124 of the explosion-proof enclosure 100.

FIGS. 3 and 4 show enclosures that show the effects of electrical components that are exposed to moisture. Specifically, FIG. 3 shows a front view of an open enclosure 300 located in an ambient environment 391, and FIG. 4 shows a detailed view of a front view of another open enclosure 400. Referring to FIGS. 1-4, the enclosure 300 of FIG. 3 has a number of enclosure devices 310, which includes a circuit breaker 399 and a number of electrical cables 309, disposed in the cavity 307. Because the enclosure 300 does not have a moisture control system, corrosion 303 has developed on various parts of the enclosure 300, including but not limited to the enclosure devices 310, the mounting plate 305, the walls of the enclosure body 324, the entry hole 316, the coupling features 320, and the enclosure engagement surface 308.

Corrosion 303 can cause one or more of a number of adverse conditions to electrical and mechanical devices within the cavity 307 of the enclosure 300, as well as to the enclosure 300 itself. For example, the corrosion 303 can cause one or more mechanical devices and/or mechanical components of one or more enclosure devices 310 disposed in the cavity 307 to seize, As another example, the corrosion 303 of wiring terminal connections can cause overheating at those terminal connections, which can degrade/destroy an associated enclosure device 310, cause a fire, and/or create some other adverse condition within the cavity 307. As yet another example, when the corrosion 303 collects on the enclosure engagement surface 308, and when the enclosure 300 is an explosion-proof enclosure, the flame path formed between the enclosure engagement surface 308 and the enclosure cover can be compromised, leading to a loss in explosion-proof integrity and creation of a safety hazard.

The enclosure 400 of FIG. 4 also has a number of enclosure devices 410, which includes a circuit breaker 499 and a number of electrical cables 409, disposed in the cavity 407. Because the enclosure 400 does not have a moisture control system, liquid 408 (e.g., beads of water formed by excessive moisture) has accumulated in the cavity 407. In this case, liquid 408 is on the enclosure devices 410, the walls of the enclosure body 424, and the entry hole 416. Over time, the liquid 408 forms corrosion within the cavity 407 of the enclosure 400. In addition, the liquid 408 can be electrically conductive and cause a ground fault when the liquid 408 accumulates in sufficient quantities at various locations in the cavity 407.

Figure 5:
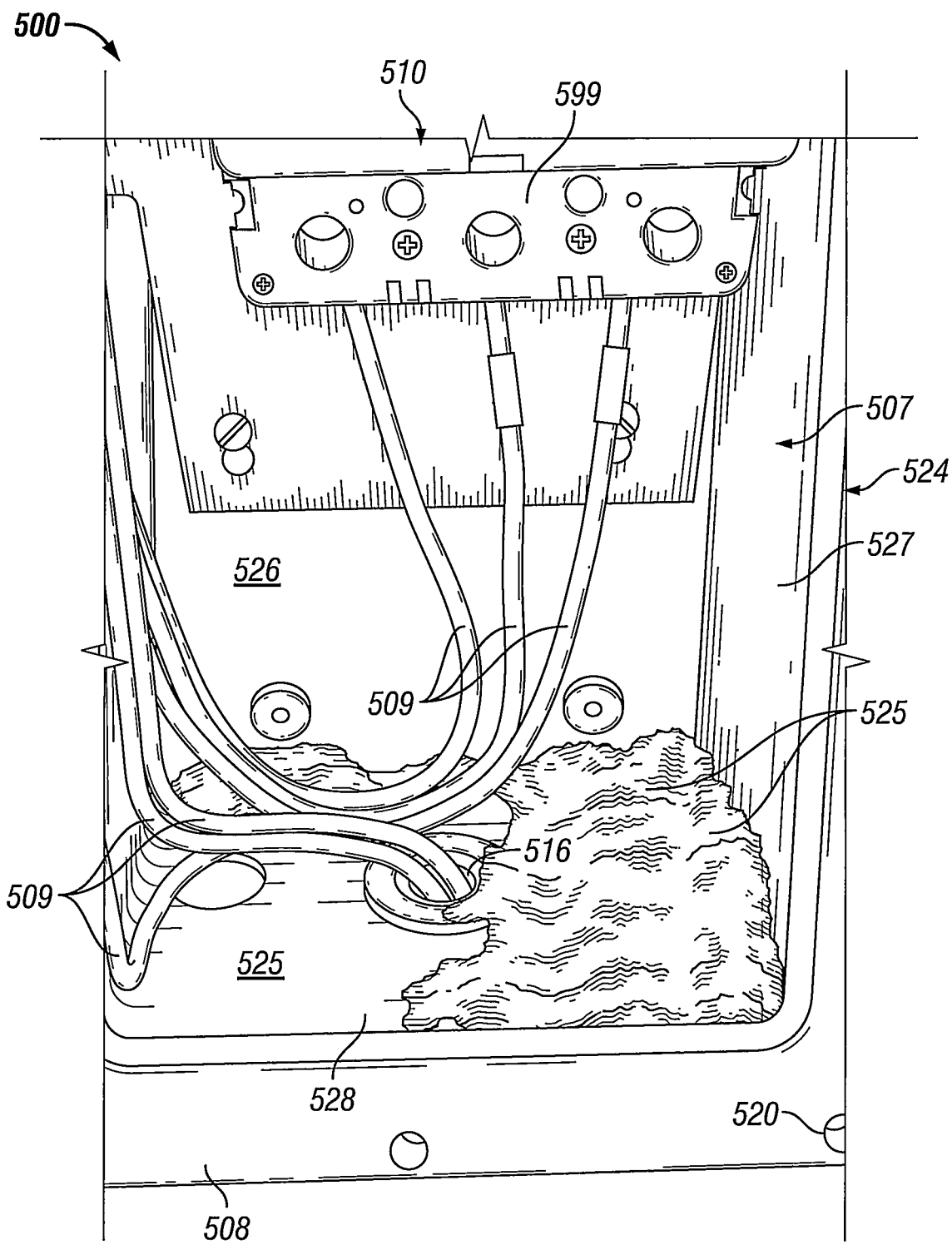
FIG. 5 shows an enclosure where desiccant has spilled onto the bottom of the enclosure.

FIG. 5 shows an enclosure 500 where desiccant 525 has spilled onto the bottom of the enclosure. Referring to FIGS. 1-5, the enclosure 500 of FIG. 5 also has one or more enclosure devices 510, which includes a circuit breaker 599 mounted on a back wall 526 of the enclosure 524 and a number of electrical cables 509, disposed in the cavity 507.

In this case, there were packages of desiccant 525 placed on the bottom wall 528 within the cavity 507 of the enclosure 500. However, since the packaging that holds the desiccant 525 fails over time, as in this case, the desiccant 525 pours out onto the bottom wall 528 within the cavity 507. When this occurs, the loose desiccant 525 can cause a mess. More importantly, the loose desiccant 525 can accumulate to plug up holes that are designed to help the operation of the enclosure devices 510. For example, one or more drains can be disposed in the bottom wall 528 of the enclosure 500. In such a case, the desiccant 525 can cover up the hole of the drain, thus rendering the drain ineffective.

Figure 6A:
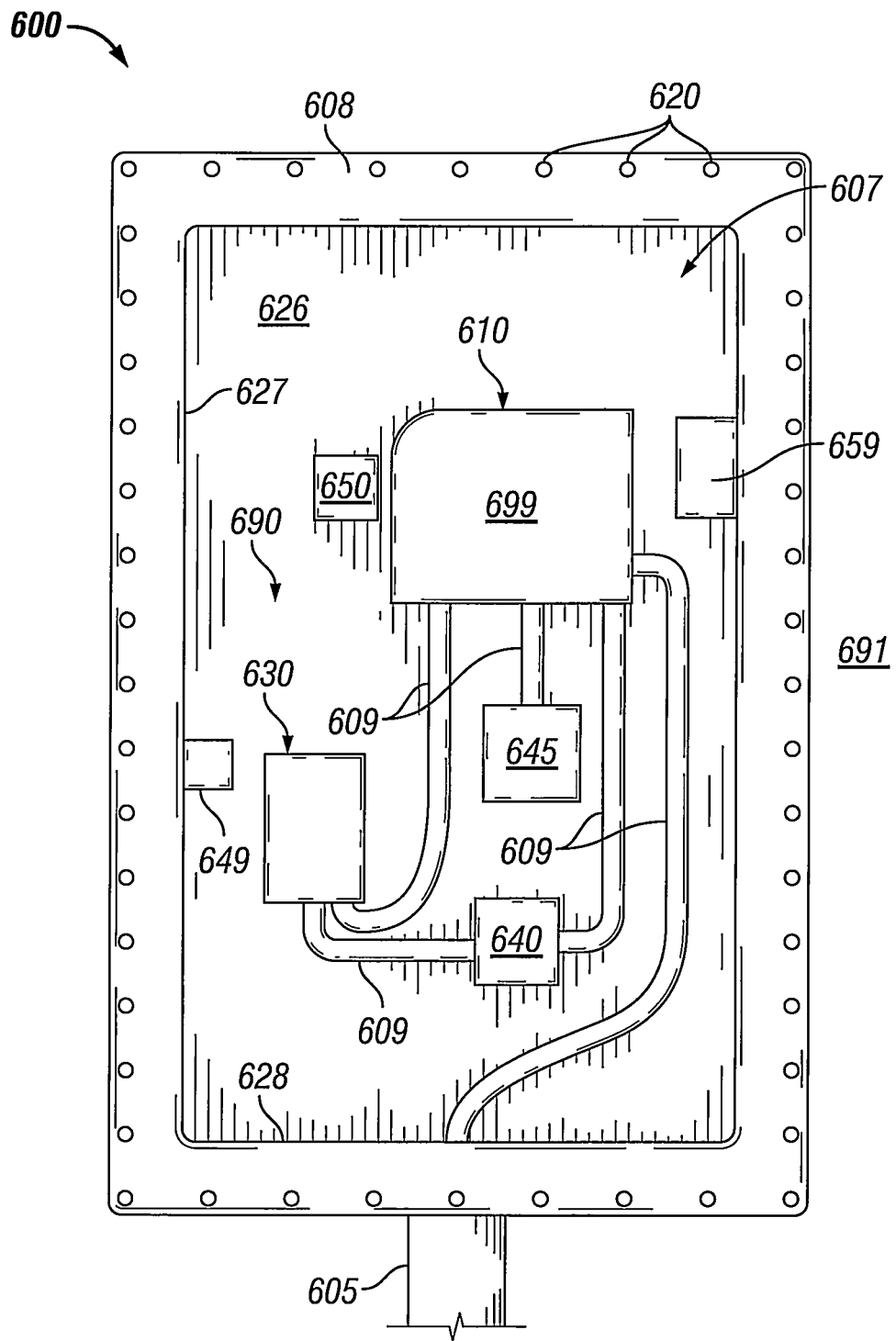
FIGS. 6A and 6B show a moisture control system for an enclosure in accordance with certain example embodiments.
Figure 6B:
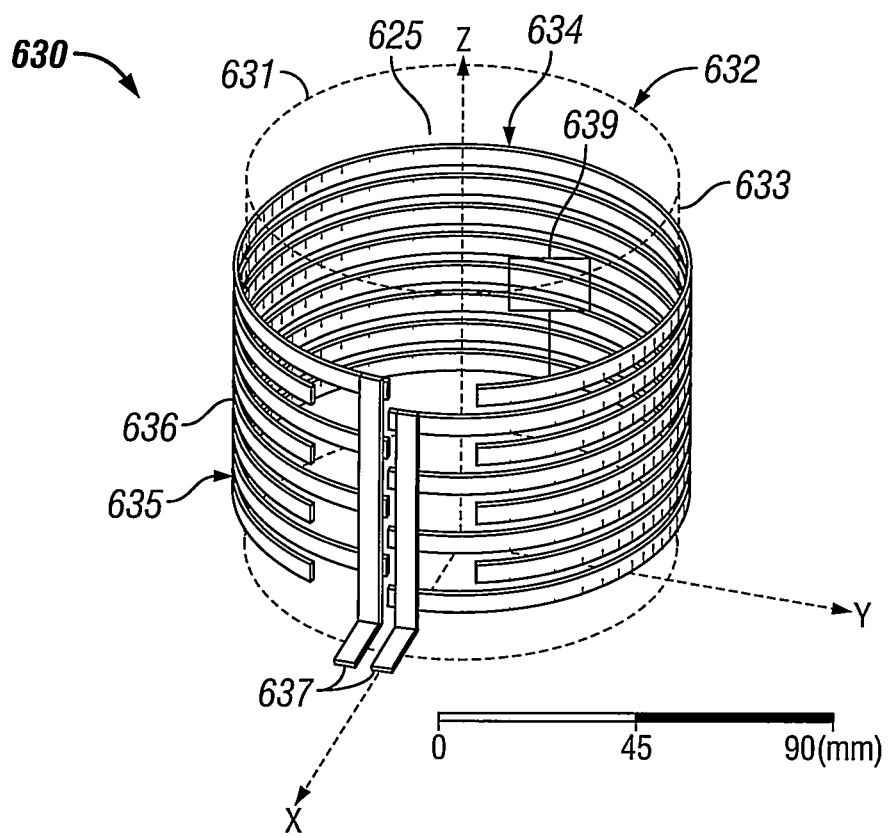

FIGS. 6A and 6B show a moisture control system 690 for an enclosure 600 in accordance with certain example embodiments. Specifically, FIG. 6A shows a front view of the enclosure 600 when the cover is removed (when the enclosure 600 is in the open position). FIG. 6B shows a semi-transparent top-side perspective view of a heated desiccant vessel 630. Referring to FIGS. 1-6B, the moisture control system 690 is located within the cavity 607 of the enclosure 600. The example moisture control system 690 can include one or more of a number of components. In this case, the moisture control system 690 includes a heated desiccant vessel 630, an optional energy storage device 640, an optional air moving device 645, an optional controller 650, an optional dehumidifier 659, and an optional breather 649 (also called a vent 649).

One or more of these components of the moisture control system 690 can be considered enclosure equipment 610. Other enclosure equipment 610 in this example includes a circuit breaker 699 and a number of electrical cables 609. A conduit 605, located in the ambient environment 691 (outside of the cavity 607 of the enclosure 600), is connected to the bottom wall 628 of the enclosure 600. One or more electrical cables 609 are disposed within the conduit 605 so that one end of those electrical cables 609 can terminate (couple to) one or more pieces of the enclosure equipment 610.

The heated desiccant vessel 630 can include one or more of a number of features and/or components. For example, as shown in FIG. 6B, the heated desiccant vessel 630 can include a heating element 635, a desiccant vessel 632, and a sensor device 639. The desiccant vessel 632 can have one or more surfaces (e.g., top surface 631, side surface 633) that forms a cavity 634. Inside the cavity can be disposed desiccant 625. In addition, in certain example embodiments, one or more sensor devices 639 can be disposed in the cavity 634. A sensor device 639 can measure one or more of a number of parameters (e.g., moisture, temperature) of the desiccant 625. For example, the sensor device 639 of FIG. 6B can be a capacitive sensor that detects an amount of moisture in the desiccant 625.

The desiccant vessel 632 can have any of a number of shapes and/or sizes. Examples of shapes of the desiccant vessel 632 can include, but are not limited to, a cylinder (as shown in FIG. 6B), a sphere, a pyramid, and a cube. The surfaces of the desiccant vessel 632 can be solid, mesh, and/or any other type of structure. The desiccant vessel 632 can be made of one or more of a number of materials, including but not limited to metal, plastic, ceramic, and cotton.

The heating element 635 can be coupled to a power source (e.g., energy storage device 640, circuit breaker 699). When power flows through the heating element 635, the heating element generates heat, which can be transferred, directly or indirectly, to the desiccant 625 within the cavity 634 of the desiccant vessel 632. The heating element 635 can be disposed on portions of one or more of the surfaces of the desiccant vessel 632. In addition, or in the alternative, the heating element 635 can be in direct contact with the desiccant 625 inside the cavity 634 of the desiccant vessel 632.

The heating element 635 can include one or more components. For example, as shown in FIG. 6B, the heating element 635 can be an electrically conductive body 636 and one or more end leads 637. Each end lead 637 is also electrically conductive and can be coupled to the body 636 and couple to a power source. The body 636 of the heating element 635 can be configured in one or more of any of a number of patterns. Such patterns can include, but are not limited to, an "S" shape, a zig-zag shape, a square-tooth shape, and random shape. The body 636 is configured to effectively heat a large surface area of the desiccant vessel 632 (and/or the desiccant 625 disposed therein).

By heating the desiccant 625, the desiccant 625 can be re-conditioned (remove the moisture from the desiccant 625). In this way, the desiccant 625 can be reused any of a number of times, allowing for extended periods of time in which the desiccant 625 can effectively reduce and/or eliminate moisture within the cavity 607 of the enclosure 600 before the desiccant 625 becomes ineffective at moisture control. In some cases, as when there is no energy storage device 640, the heating element 635 can heat the desiccant 625 during normal operation (i.e., when the primary power is being provided to the enclosure devices 610), which conditions (removes the moisture from) the desiccant 625.

When the moisture control system 690 includes the optional energy storage device 640, the optional air moving device 645, the optional controller 650, the optional dehumidifier 659, and/or the optional breather 649, the effectiveness and longevity of the moisture control system 690 can be further increased. The energy storage device 640 can include one or more of a number of energy storage components (e.g., battery, supercapacitor) that charge when system power (also called primary power) is provided to the enclosure components 610, and that release reserve power (also called stored power) to provide the reserve power to one or more enclosure components 610 when the primary power is interrupted.

In this case, the energy storage device 640 can be used to provide reserve power to the heating element 635 and/or the sensor device 639 when the primary power (provided, for example, by the circuit breaker 699) is interrupted. The optional air moving device 645 can be a fan, a blower, or any other type of device that circulates air within the cavity 607 of the enclosure 600. The air moving device 645 can operate on any type of power (e.g., primary power, reserve power) available within the enclosure 600. The air moving device 645 can operate continuously, at regular time intervals, during certain conditions (e.g., when the moisture content of the desiccant 625, as measured by the sensor device 639, exceeds a threshold value), randomly, and/or based on any other factor. The air moving device 645 can be controlled by the controller 650.

The optional breather 649 can be any device that allows air from within the cavity 607 of the enclosure 600 to traverse therethrough to the ambient air 691 outside the enclosure 600. The breather 649 can have one or more components. The various components of the breather 649 can be stationary or movable to allow air from within the cavity 607 to vent to the ambient air 691. There can be one or more breathers 649, and each breather can be mounted on any surface (e.g., side wall 627, bottom wall 628) of the enclosure 600.

The optional dehumidifier 659 can be any device that removes humidity from within the cavity 607 of the enclosure 600. The dehumidifier 659 can have one or more components. The various components of the dehumidifier 659 can be stationary or movable to remove the humidity from the air within the cavity 607. There can be one or more dehumidifiers 659, and each dehumidifier can be mounted on any surface (e.g., side wall 627, bottom wall 628) of the enclosure 600.

The optional controller 650 can be used to control (using control signals) one or more components of the moisture control system 690. In addition, the controller 650 can send and/or receive power signals, data signals, and/or other types of signals. The controller 650 can be coupled to the heating element 635, and sensor device 639, the dehumidifier 659, and/or the energy storage device 640. The controller 650 can operate using any type of power (e.g., primary power, reserve power) available within the enclosure 600.

In certain example embodiments, the controller 650 can detect when the primary power is interrupted and for how long. If the moisture control system 690 includes an energy storage device 640, then the controller 650 can instruct the energy storage device 640 to provide reserve power to the heating element 635 until the primary power is restored. The controller 650 can also instruct the sensor device 639 to measure a parameter, communicate the measurement of the parameter back to the controller 650, evaluate the measurement of the parameter, and instruct one or more other components of the moisture control system 690 to operate based on the evaluation of the measurement of the parameter.

For example, rather than having power constantly flow to the heating element 635, the controller 650 can allow power (e.g., primary power, reserve power) to flow to the heating element 635 when the moisture level, measured by the sensor device 639, in the desiccant 625 is above a certain threshold value. When the moisture level drops below another threshold value, then the controller 650 can stop the power from flowing to the heating element 635.

The controller 650 can also communicate with a user (e.g., a network manager). For example, if the controller 650 determines that the desiccant 625 needs to be replaced, then the controller 650 can notify the user and also recommend an optimal time (based, for example, on operational conditions) as to when the desiccant 625 should be replaced. As another example, if the primary power has been interrupted for an extended period of time and the moisture content of the desiccant 625 exceeds an extreme threshold value, than the controller 650 can notify the user of an emergency condition within the cavity 607 of the enclosure 600 that requires immediate attention. The controller 650 can allow for continuous monitoring and/or operation of the moisture control system 690, whether by itself or as part of a larger control network. More details of the controller 650 are provided below with respect to FIG. 11.

Figure 7:
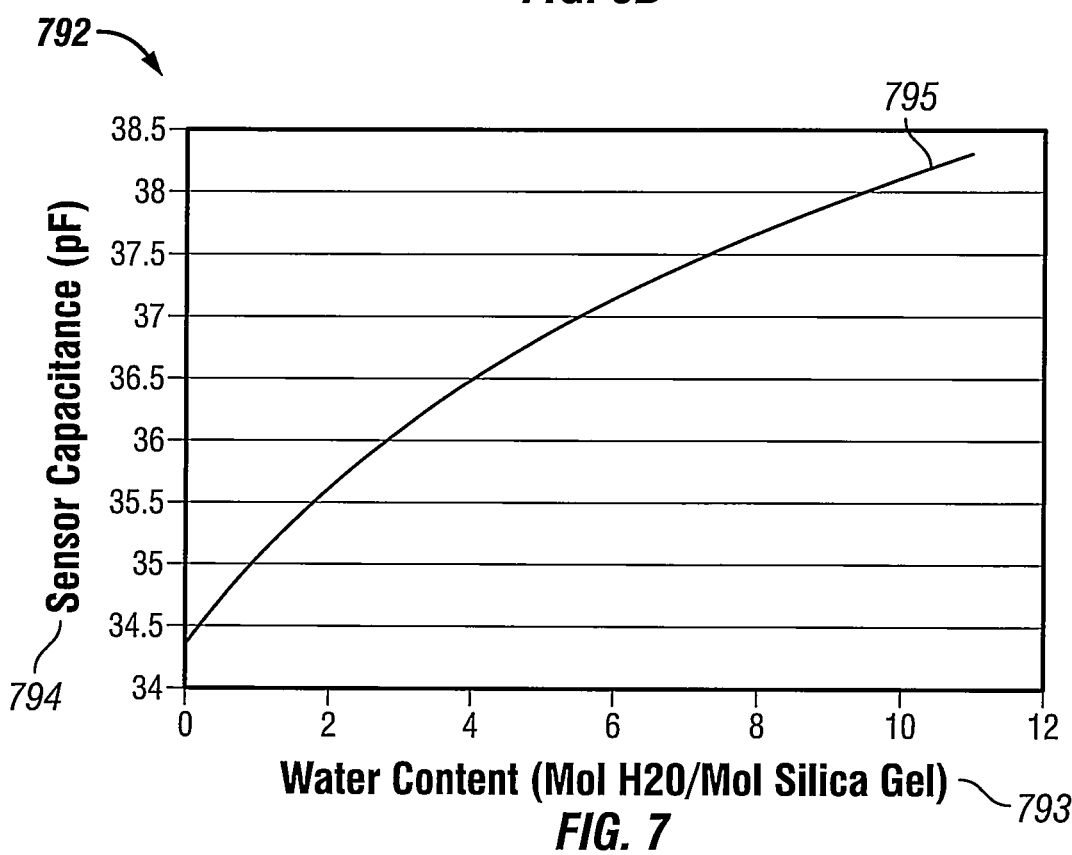
FIG. 7 shows a graph of the relationship between capacitance and water content for a sensor of the moisture control system of FIGS. 6A and 6B.

FIG. 7 shows a graph of the relationship between capacitance and water content for a sensor of the moisture control system of FIGS. 6A and 6B. Referring to FIGS. 1-7, the graph 792 of FIG. 7 shows a curve 795 that is a continuous plot of water content 793 versus capacitance 794 for a sensor device 639. The water (moisture) content 793 is with respect to the desiccant 625 of the heated desiccant vessel 630. The sensor device 639 in this case is a capacitive sensor, and so an increase in capacitance corresponds to an increase in the moisture content in the dessicant 625, as shown in the curve 795.

Figure 8:
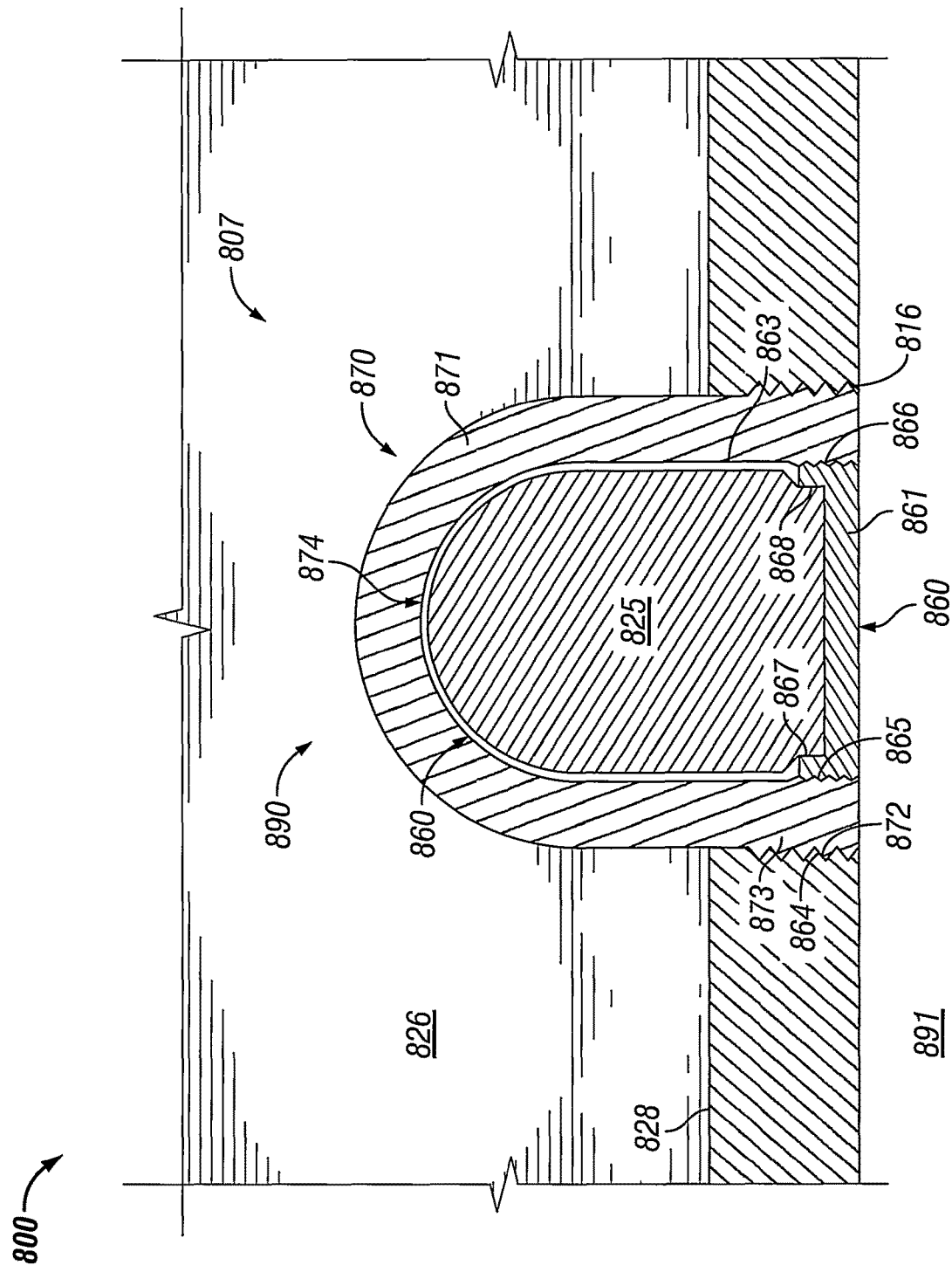
FIG. 8 shows a cross-sectional front view of another moisture control system for an enclosure in accordance with certain example embodiments.

FIG. 8 shows another moisture control system 890 for an enclosure 800 in accordance with certain example embodiments. Referring to FIGS. 1-8, the moisture control system 890 can include one or more components. In this case, the moisture control system 890 of FIG. 8 includes a structural filter 870 and a desiccant vessel 860 that is removably coupled to the structural filter 870. At least a portion of the structural filter 870 is disposed in the cavity 807 of the enclosure 800. The structural filter 870 can be disposed in a hole 816 (aperture 816) in a wall (e.g., the bottom wall 828 (as in this case), a side wall) of the enclosure 800.

The structural filter 870 can have any of a number of configurations made of any of a number of materials that allow moisture to traverse therethrough. In some cases, the structural filter 870 can have properties that allow for compliance with explosion-proof enclosures or enclosures in other hazardous environments. For example, in such a case, at least some of the structural filter 870 can be made of a sintered material. The structural filter 870 can include one or more of a number of features. For example, in this case, the structural filter 870 can include a body 871 and a base 873. The base 873 can include one or more of a number of coupling features 872 (in this case, mating threads) that are used to couple to complementary coupling features 864 (also mating threads in this case) disposed in a hole 816 in a wall (e.g., bottom wall 828) of the enclosure 800.

At least a portion of the body 871 of the structural filter 870 can be disposed in the cavity 807 of the enclosure 800. The body 871 can form a cavity 874 into which the desiccant vessel 860 can be disposed. In some cases, the inner surface of the body 871 has a shape that is substantially the same as and a size that is slightly larger than a shape and size of the desiccant vessel 860. In certain example embodiments, the base 873 of the structural filter 870 can include additional coupling features 866 that are used to couple to complementary coupling features 865 on the base 861 of the desiccant vessel 860. In this case, coupling features 866 are mating threads that are disposed on the inner surface of the base 873 of the structural filter 870, and coupling features 865 are complementary mating threads that are disposed on the outer surface of the base 861 of the desiccant vessel 860.

The desiccant vessel 860 of the moisture control system 890 of FIG. 8 can be substantially the same as the desiccant vessel 632 of the moisture control system 690 of FIG. 6, except as described below. In this case, as discussed above, the desiccant vessel 860 of FIG. 8 includes a body 863 and a base 861. The body 863 can be made of a permeable material (e.g., a mesh) that allows moisture to traverse therethrough to get to the desiccant 825 disposed within the body 863. In certain example embodiments, the body 863 of the desiccant vessel 860 is configured so that the desiccant 825 can be accessed by a user when the desiccant vessel 860 is removed from the cavity 874 of the structural filter 870. For example, the body 863 can include one or more coupling features 867 (in this case, mating threads) that couple to complementary coupling features 868 (also mating threads in this case) of the base 861 of the desiccant vessel 860.

Figure 9A:
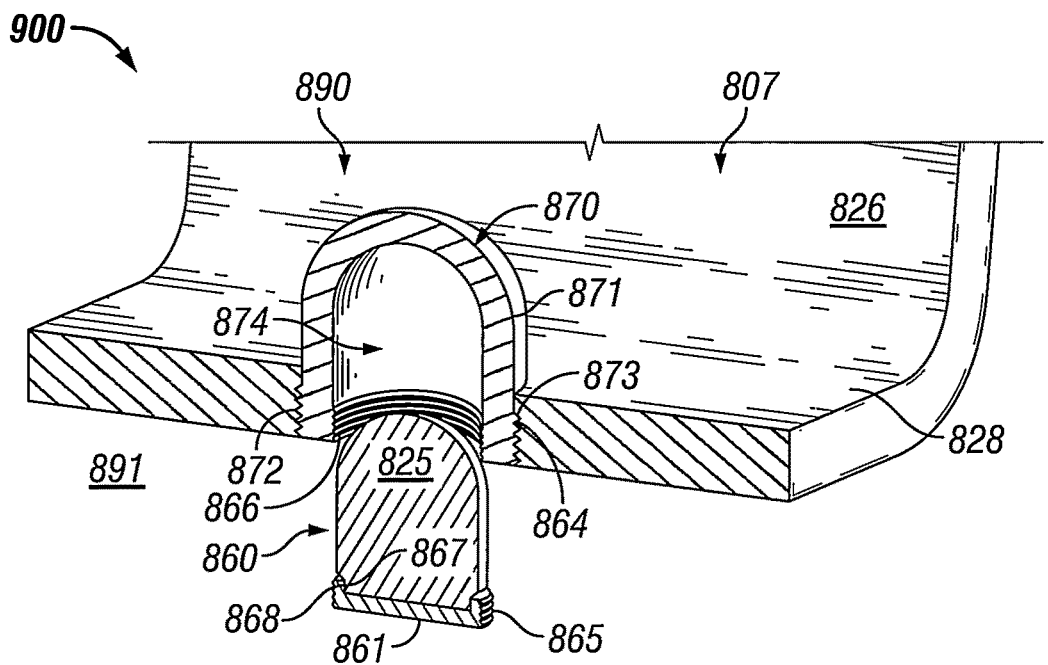
FIGS. 9A and 9B show a cross-sectional front-side view and a cross-sectional front view, respectively, of a variation of the moisture control system of FIG. 8.
Figure 9B:
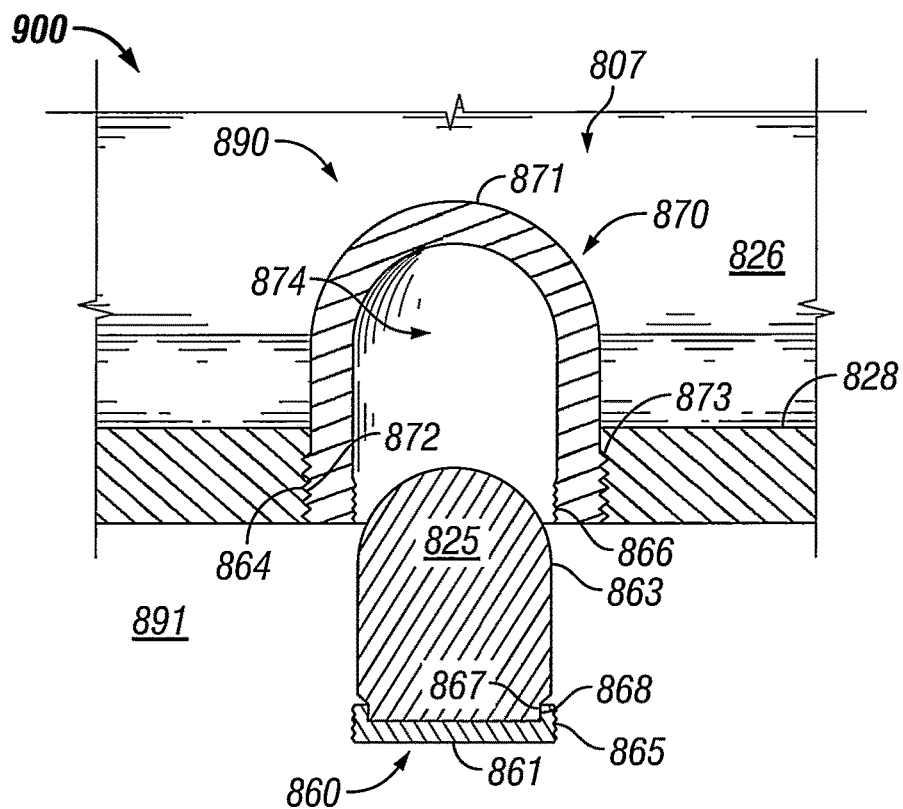

FIGS. 9A and 9B show a variation of the enclosure 800 of FIG. 8. Specifically, FIGS. 9A and 9B shows an enclosure 900 where the desiccant vessel 860 is decoupled from the structural filter 870 of the moisture control system 890. For example, in this case, a user can unscrew the desiccant vessel 860 by the base 861 from the base 873 of the structural filter 870. In this way, the desiccant vessel 860 can be removed from the structural filter 870, providing access to the desiccant 825, without requiring a user to open the enclosure 900.

In certain example embodiments, the base 861 of the desiccant vessel 860 can be made of a material with properties (e.g., translucent, transparent, semi-transparent) that allows a user to see therethrough. In such a case, the desiccant 825 within the body 863 of the desiccant vessel 860 can change color when the amount of moisture absorbed by the desiccant 825 exceeds a threshold amount. In such a case, a user can visually determine when the desiccant 825 in the desiccant vessel 860 needs to be replaced without having to open the enclosure 900 or test the desiccant 825. If the desiccant 825 is capable of changing colors, the desiccant 825 can transform through a range of colors, where each color (or shade of a color) corresponds to a different amount of moisture absorbed by the desiccant 825. In some cases, the body 863 of the desiccant vessel 860 can provide some visible indication (e.g., change color, extend a component of the body 863) that the moisture content of the desiccant 825 has exceeded a threshold value.

Figure 10A:
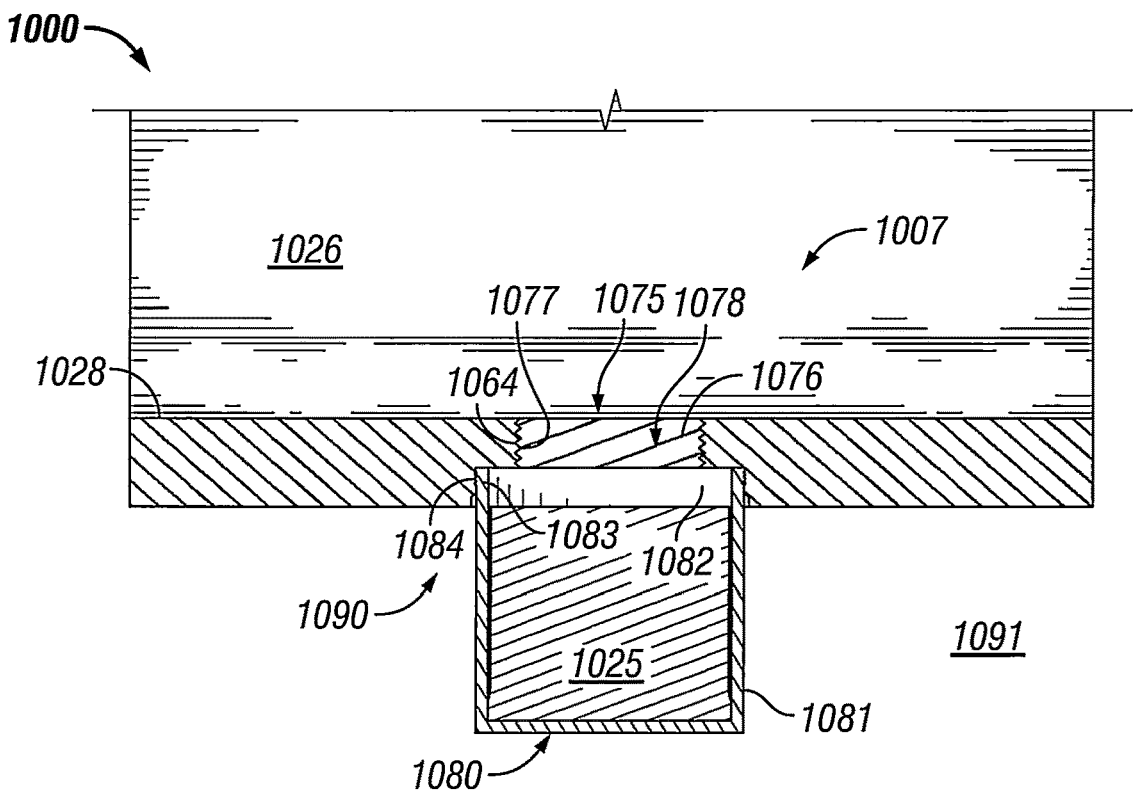
FIGS. 10A and 10B show a cross-sectional front view and a cross-sectional front-side view, respectively, of still another moisture control system for an enclosure in accordance with certain example embodiments.
Figure 10B:
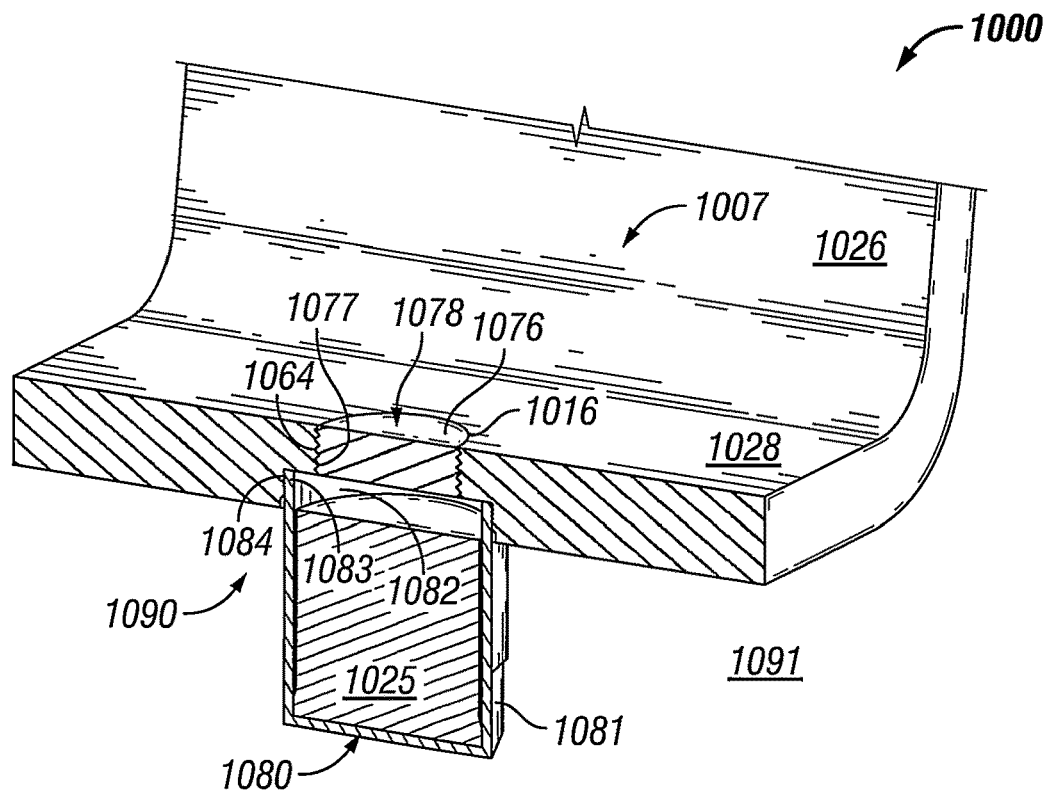

FIGS. 10A and 10B show still another moisture control system 1090 for an enclosure 1000 in accordance with certain example embodiments. Referring to FIGS. 1-10, the moisture control system 1090 of FIG. 10 is disposed in a wall (e.g., bottom wall 1028) of the enclosure 1000. The moisture control system 1090 in this example includes a structural filter 1075 (in this case, sometimes referred to as a drain or a breather) and a desiccant vessel 1080. In this case, the structural filter 1075 is disposed within a hole 1016 in a wall (e.g., bottom wall 1028) of the enclosure 1000. The structural filter 1075 (including components thereof, such as the body 1076) of FIGS. 10A and 10B can have substantially similar properties compared to the structural filter (including corresponding components thereof) of FIGS. 8, 9A, and 9B above. For example, the structural filter 1075 of FIGS. 10A and 10B can be made of a sintered material.

The structural filter 1075 can have any of a number of configurations made of any of a number of materials that allow moisture to traverse therethrough. In some cases, the structural filter 1075 can have properties that allow for compliance with explosion-proof enclosures or enclosures in other hazardous environments. The structural filter 1075 can include one or more of a number of features. For example, in this case, the structural filter 1075 can include a body 1076 that includes one or more of a number of coupling features 1077 (in this case, mating threads) that are used to couple to complementary coupling features 1064 (also mating threads in this case) disposed in the hole 1016 in a wall (e.g., bottom wall 1028) of the enclosure 1000.

At least a portion of the body 1076 of the structural filter 1075 can be disposed flush with, protrude from, or be recessed with respect to the wall (in this case, bottom wall 1028) of the enclosure 1000. The body 1076 of the structural filter 1075 can have any length, including but not limited to a length that is less than the thickness of the bottom wall 1028 (as in this case), length that is the same as the thickness of the bottom wall 1028, and a length that is greater than the thickness of the bottom wall 1028. If the length of the body 1076 of the structural filter 1075 is at least as great as the thickness of the bottom wall 1028, then the body 1076 can have one or more of a number of additional features that allow the desiccant vessel 1080 to be in removable communication with (e.g., removably coupled with respect to) the structural filter 1075.

In certain example embodiments, the body 1076 of the structural filter 1075 can have one or more apertures 1078 (or other similar features) that traverse the thickness (height) of the body 1076. In this way, moisture that accumulates in the cavity 1007 of the enclosure 1000 can reach the structural filter 1075 and flow down through the apertures 1078. Similarly, humid air within the cavity 1007 of the enclosure 1000 can be in communication with the desiccant vessel 1080 through the apertures 1078 in the structural filter 1075. The structural filter 1075 can be coupled to, abut against, or otherwise be in communication with the desiccant vessel 1080. In this example, the structural filter 1075 abuts against the desiccant vessel 1080. If the structural filter 1075 is coupled to the desiccant vessel 1080, then the structural filter 1075 and the desiccant vessel 1080 can have one or more additional coupling features aside from what is shown in FIGS. 10A and 10B.

The desiccant vessel 1080 of the moisture control system 1090 of FIG. 10 can be substantially the same as the desiccant vessel 1060 of the moisture control system 890 of FIGS. 8-9B, except as described below. In this case, as discussed above, the desiccant vessel 1080 of FIGS. 10A and 10B includes a body 1081 and a base 1082. The body 1081 can be made of any suitable material (e.g., a mesh, a solid) that houses and protects the desiccant 1025 from the ambient environment 1091 while allowing moisture that passes through the apertures 1078 in the structural filter 1075 to be absorbed by the desiccant 1025 disposed within the body 1081. In certain example embodiments, the body 1081 of the desiccant vessel 1080 is configured so that the desiccant 1025 can be accessed by a user when the desiccant vessel 1080 is removed from the enclosure 1000. For example, the body 1081 of the desiccant vessel 1080 can include one or more coupling features 1083 (in this case, mating threads) that couple to complementary coupling features 1084 (also mating threads in this case) that define at least the outer-most portion of the hole 1016 in the bottom wall 1028 of the enclosure 1000.

The configuration of the moisture control system 1090 of FIGS. 10A and 10B allows a user to remove the desiccant vessel 1080 without opening the enclosure 1000. For example, in this case, a user can unscrew the desiccant vessel 1080 by the base 1082 from the bottom wall 1028 of the enclosure 1000. Alternatively, if the desiccant vessel 1080 is coupled to the structural filter 1075 rather than the bottom wall 1028 of the enclosure 1000, then a user can unscrew the desiccant vessel 1080 by the base 1082 from the structural filter 1075.

Figure 11:
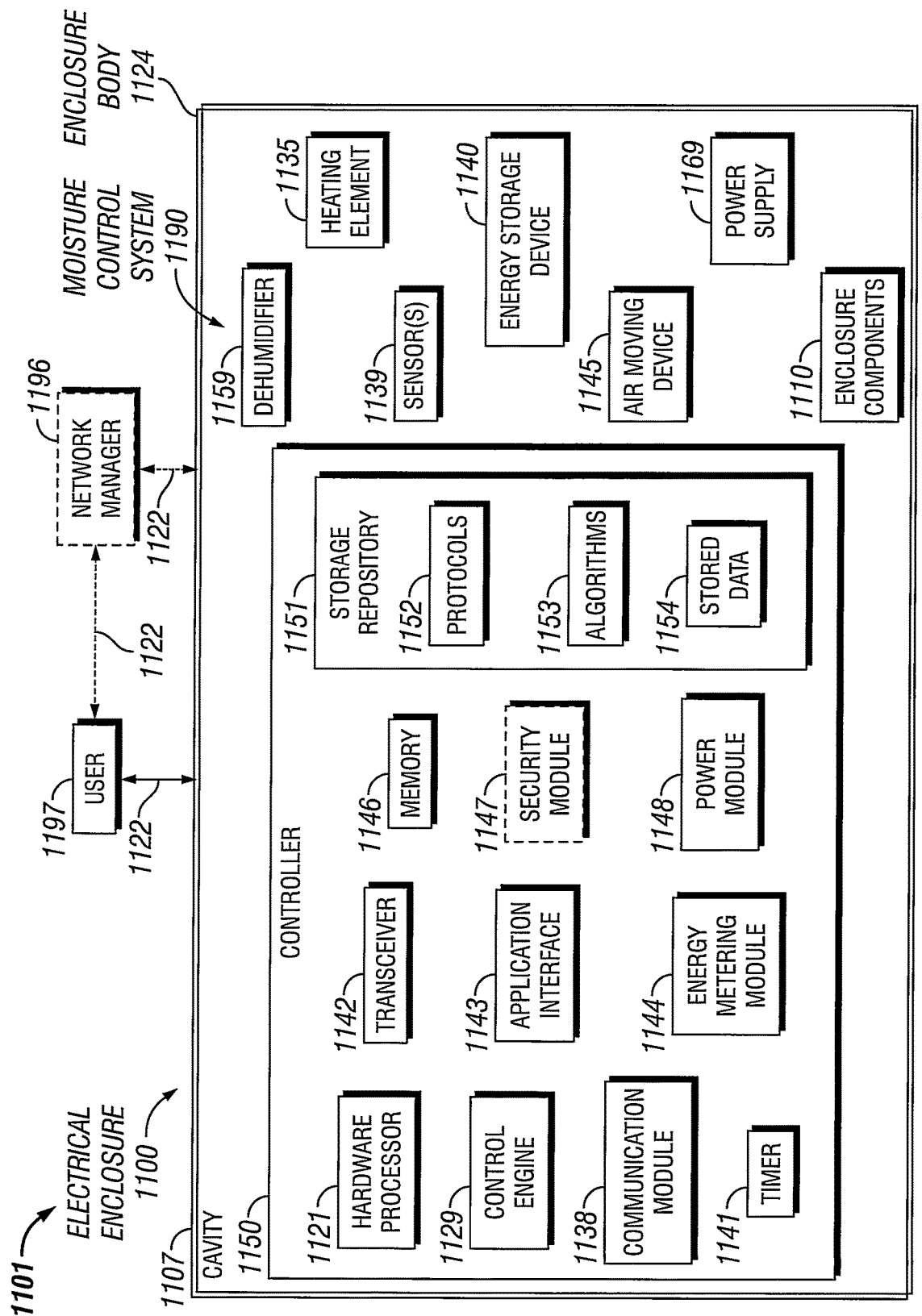
FIG. 11 shows a diagram for a system in accordance with certain example embodiments.

FIG. 11 shows a diagram for a system 1101 in accordance with certain example embodiments. Referring to FIGS. 1-11, in addition to the electrical enclosure 1100, the system 1101 of FIG. 11 can include a user 1197 and an optional network manager 1196. The electrical enclosure 1100 can include one or more enclosure components 1110, a power supply 1169, and a moisture control system 1190. The moisture control system 1190 can include, for example, a controller 1150, an energy storage device 1140, an air moving device 1145, a dehumidifier 1159, a heating element 1135, and one or more sensors 1139. The controller 1150 can include one or more of a number of components. Such components, can include, but are not limited to, a control engine 1129, a communication module 1138, a timer 1141, a power module 1148, an energy metering module 1144 (also called, more simply, a metering module 1144 herein), a storage repository 1151, a hardware processor 1121, a memory 1146, a transceiver 1142, an application interface 1143, and, optionally, a security module 1147. The components shown in FIG. 11 are not exhaustive, and in some embodiments, one or more of the components shown in FIG. 11 may not be included in an example electrical enclosure 1100. Any component of the example electrical enclosure 1100 can be discrete or combined with one or more other components of the electrical enclosure 1100.

The user 1197 is the same as a user defined above. The user 1197 interacts with (e.g., sends instructions to, sends settings to, receives data from) the electrical enclosure 1100 (including any portions thereof, such as the controller 1150, the sensors 1139) via the application interface 1143 and one or more communication links 1122 (described below). The user 1197 can also interact with a network manager 1196. Interaction between the user 1197 and the electrical enclosure 1100 and/or the network manager 1196 can be conducted using communication links 1122. The communication links 1122 can transmit signals (e.g., electrical power, communication signals, control signals, data) between the electrical enclosure 1100, the user 1197, and the network manager 1196.

The network manager 1196 is a device or component that can communicate with the controller 1150. For example, the network manager 1196 can send instructions to the controller 1150 of the electrical enclosure 1100 as to when the dehumidifier 1159 and/or the heating element 1135 should be operated. As another example, the network manager 1196 can receive data associated with the operation of the moisture control system 1190 of the electrical enclosure 1100. Such data can be used for any of a number of purposes, such as determining when maintenance should be performed on the moisture control system 1190 or portions thereof.

The electrical enclosure 1100 can use one or more of a number of communication protocols (a type of protocol 1152). The electrical enclosure 1100 can include and/or be coupled to one or more sensors 1139. A sensor 1139 can be substantially similar to a sensor described above. These sensors 1139 can measure one or more parameters in and/or around the electrical enclosure 1100. Examples of such parameters can include, but are not limited to, temperature, pressure, air quality, air composition, water level, moisture content (for example, for desiccant), and humidity. Examples of a sensor 1139 can include, but are not limited to, thermometer, pressure gauge, a spectrometer, a moisture meter, an oxygen meter, an infrared sensor, and an accelerometer. In some cases, a sensor 1139 can send a parameter, in addition to or in the alternative of measuring a parameter. For example, if a sensor 1139 is a thermometer, then the sensor 1139 can send a signal (for example, to the controller 1150) to indicate the measured temperature at a particular location in the electrical enclosure 1100.

The enclosure components 1110, the energy storage device 1140, the air moving device 1145, the dehumidifier 1159, and the heating element 1135 of FIG. 11 can be substantially the same as the enclosure components, the energy storage device, the air moving device, the dehumidifier, and the heating element described above. The power supply 1169 of the electrical enclosure 1100 can send power, control, and/or communication signals to the controller 1150, the sensors 1139, the enclosure components 1110, the energy storage device 1140, the air moving device 1145, the dehumidifier 1159, and/or the heating element 1135. The power supply 1169 can include one or more components. Examples of components of a power supply 1169 can include, but are not limited to, a transformer, a generator, a battery, an electrical receptacle, an electrical cable, an electrical conductor, a fuse, a breaker, and an inductor. The power supply 1169 can be a source of independent power generation. For example, the power supply 1169 can include an energy storage device (e.g., a battery, a supercapacitor). As another example, the power supply 1169 can include photovoltaic solar panels. In addition, or in the alternative, the power supply 1169 can receive power from an independent power supply. The independent power supply can be any source of power that is independent of the power supply 1169. Examples of a power supply can include, but are not limited to, an energy storage device, a step-down transformer, a feed to a building, a feed from a circuit panel, and an independent generation source (e.g., photovoltaic panels, a heat exchanger).

In certain example embodiments, the power supply 1169 sends power, control, and/or communication signals to, and receives power, control, and/or communication signals from, the controller 1150 of the electrical enclosure 1100. In this way, the controller 1150 of the electrical enclosure 1100 can control the amount of power sent by the power supply 1169 to the sensors 1139, an energy storage device 1140, an air moving device 1145, a dehumidifier 1159, and/or a heating element 1135.

The controller 1150 of the electrical enclosure 1100 can be substantially the same as the controller 650 described above with respect to FIG. 6A. The controller 1150 of FIG. 11 can interact (e.g., periodically, continually, randomly) with the user 1197, the network manager 1196 and/or one or more other components of the moisture control system 119014. The user 1197, the network manager 1196, and/or the other components of the moisture control system 1190 can interact with the controller 1150 of the electrical enclosure 1100 using the application interface 1143 and/or the communication links 1122 in accordance with one or more example embodiments. For example, the application interface 1143 of the controller 1150 can receive data (e.g., information, communications, instructions) from and sends data (e.g., information, communications, instructions) to the user 1197 and the network manager 1196.

The controller 1150, the user 1197, and/or the network manager 1196 can use their own system or share a system in certain example embodiments. Such a system can be, or contain a form of, an Internet-based or an intranet-based computer system that is capable of communicating with various software. A computer system includes any type of computing device and/or communication device, including but not limited to the controller 1150. Examples of such a system can include, but are not limited to, a desktop computer with LAN, WAN, Internet or intranet access, a laptop computer with LAN, WAN, Internet or intranet access, a smart phone, a server, a server farm, an android device (or equivalent), a tablet, smartphones, and a personal digital assistant (PDA). Such a system can correspond to a computer system as described below with regard to FIG. 12.

Further, as discussed above, such a system can have corresponding software (e.g., user software, network manager software, control module software). The software can execute on the same or a separate device (e.g., a server, mainframe, desktop personal computer (PC), laptop, PDA, television, cable box, satellite box, kiosk, telephone, mobile phone, or other computing devices) and can be coupled by the communication network (e.g., Internet, Intranet, Extranet, Local Area Network (LAN), Wide Area Network (WAN), or other network communication methods) and/or communication channels, with wire and/or wireless segments according to some example embodiments. The software of one system can be a part of, or operate separately but in conjunction with, the software of another system within the system 1101.

As discussed above, the electrical enclosure 1100 can include an enclosure body 112 and an enclosure cover. The enclosure body 112 can include at least one wall that forms a cavity 1107, and the cavity 1107 becomes enclosed when the enclosure cover couples to the enclosure body 112. The enclosure body 112 of the electrical enclosure 1100 can be used to house one or more components (e.g., the power supply 1169, the sensors 1139, the energy storage device 1140, the air moving device 1145, the dehumidifier 1159, the heating element 1135) of the electrical enclosure 1100, including one or more components of the controller 1150. For example, as shown in FIG. 11, the controller 1150 (which in this case includes the control engine 1129, the communication module 1138, the storage repository 1151, the hardware processor 1121, the memory 1146, the transceiver 1142, the application interface 1143, the timer 1141, the energy metering module 1144, the power module 1148, and the optional security module 1147) can be disposed within the cavity 1107 formed by the enclosure body 112. In alternative embodiments, any one or more of these or other components (or portions thereof) of the electrical enclosure 1100 can be disposed on the enclosure body 112 and/or remotely from the enclosure body 112.

The storage repository 1151 can be a persistent storage device (or set of devices) that stores software and data used to assist the controller 1150 in communicating with the user 1197, and the network manager 1196 within the system 1101. In one or more example embodiments, the storage repository 1151 stores one or more protocols 1152 (which can include communication protocols), algorithms 1153, and stored data 1154. The protocols 1152 can be any procedures (e.g., a series of method steps) and/or other similar operational procedures that the control engine 1129 of the controller 1150 follows based on certain conditions at a point in time. The protocols 1152 can include any of a number of communication protocols 1152 that are used to send and/or receive data between the controller 1150 and one or more components within and/or outside the system 1101. For example, one or more protocols 1152 can be a process or procedure by which the controller 1150 (or portions thereof) operates under a given set of conditions (e.g., time, readings by sensor 1139, measurements by energy metering module 1144).

A protocol 1152 can be used for wired and/or wireless communication used to send and/or receive data between the controller 1150, the user 1197, and the network manager 1196. Examples of a protocol 1152 can include, but are not limited to, Modbus, profibus, Ethernet, and fiberoptic. One or more of the communication protocols 1152 can be a time-synchronized protocol. Examples of such time-synchronized protocols can include, but are not limited to, a highway addressable remote transducer (HART) protocol, a wirelessHART protocol, and an International Society of Automation (ISA) 100 protocol. In this way, one or more of the communication protocols 1152 can provide a layer of security to the data transferred within the system 1101.

The algorithms 1153 can be any formulas, logic steps, mathematical models, and/or other suitable means of manipulating and/or processing data. For example, the controller 1150 can use the algorithms 1153 and the protocols 1152 to measure (using the energy metering module 1144) one or more parameters (e.g., temperature, pressure, humidity) within the cavity 1107 of the electrical enclosure 1100 (as measured by one or more sensors 1139), store (as stored data 1154 in the storage repository 1151) the resulting measurements, and evaluate the stored data 1154 using one or more of the algorithms 1153.

As another example, the controller 1150 can use one or more other algorithms 1153 and protocols 1152 to continuously monitor the measurements made by the sensors 1139, and use this data to determine the operating parameters (e.g., whether the amount of moisture in the desiccant (e.g., desiccant 825) is outside an acceptable range of values) of the moisture control system 1190 of the electrical enclosure 1100. As another example, the controller 1150 can use yet another algorithm 1153 to measure one or more parameters of the moisture control system 1190, and use this data to determine whether one or more characteristics (e.g., moisture content, temperature) is within acceptable parameters (also called threshold values, and also part of the stored data 1154).

Stored data 1154 can be any data associated with the electrical enclosure 1100 (including any components thereof), any measurements taken by the sensors 1139, measurements taken by the metering module 1144, time measured by the timer 1141, threshold values, acceptable ranges of values, historical measured values, information associated with the various components (e.g., the enclosure components 1110, the energy storage device 1140, the air moving device 1145, the dehumidifier 1159, the heating element 1135, the sensors 1139) within the electrical enclosure 1100, performance history of the one or more of the various components within the electrical enclosure 1100, results of previously run or calculated algorithms 1153, and/or any other suitable data. The stored data 1154 can be associated with some measurement of time derived, for example, from the timer 1141.

Examples of a storage repository 1151 can include, but are not limited to, a database (or a number of databases), a file system, a hard drive, flash memory, some other form of solid state data storage, or any suitable combination thereof. The storage repository 1151 can be located on multiple physical machines, each storing all or a portion of the protocols 1152, the algorithms 1153, and/or the stored data 1154 according to some example embodiments. Each storage unit or device can be physically located in the same or in a different geographic location.

The storage repository 1151 can be operatively connected to the control engine 1129. In one or more example embodiments, the control engine 1129 includes functionality to communicate with the user 1197 and the network manager 1196 in the system 1101. More specifically, the control engine 1129 sends information to and/or receives information from the storage repository 1151 in order to communicate with the user 1197 and the network manager 1196. As discussed below, the storage repository 1151 can also be operatively connected to the communication module 1138 in certain example embodiments.

In certain example embodiments, the control engine 1129 of the controller 1150 controls the operation of one or more components (e.g., the communication module 1138, the timer 1141, the transceiver 1142) of the controller 1150. For example, the control engine 1129 can put the communication module 1138 in "sleep" mode when there are no communications between the controller 1150 and another component (e.g., the user 1197) in the system 1101 or when communications between the controller 1150 and another component in the system 1101 follow a regular pattern. In such a case, power consumed by the controller 1150 is conserved by only enabling the communication module 1138 when the communication module 1138 is needed.

As another example, the control engine 1129 can acquire the current time using the timer 1141. The timer 1141 can enable the controller 1150 to control the power supply 1169 (and so also the moisture control system 1190) of the electrical enclosure 1100, even when the controller 1150 has no communication with the user 1197 and/or the network manager 1196. In certain example embodiments, the timer 1141 can track the amount of time that the moisture control system 1190 (including any one or more components thereof) is operating. In such a case, the control engine 1129 can control the power supply 1169 (and so also the moisture control system 1190) based on an amount of time measured by the timer 1141.

In addition to the aspects and capabilities of the controller 1150 described above, the control engine 1129 of the controller 1150 can provide direct or indirect control of any aspect of operation of the moisture control system 1190. For example, the control engine 1129 can control the operation of the enclosure components 1110, the energy storage device 1140, the air moving device 1145, the dehumidifier 1159, the heating element 1135, the power supply 1169, and/or any other component within the cavity 1107 of the electrical enclosure 1100.

In certain example embodiments, the control engine 1129 can analyze data stored in the storage repository 1151 using one or more algorithms 1153 stored in the storage repository 1151. In this way, the control engine 1129 can provide a historical analysis and/or a predictive analysis to a user 1197 regarding the moisture control system and/or the enclosure components 1110 in the system 1101. In such a case, for example, the control engine 1129 can establish a preventative maintenance program for the electrical enclosure 1100, including any specific components (e.g., the desiccant, the power supply 1169, a component of the moisture control system 1190, the enclosure components 1110) thereof.

In addition, the control engine 1129 of the controller 1150 can receive measurements made by one or more of the sensors 1139 and use these measurements to determine when certain actions should be taken relative to one or more components within the enclosure 1100. For example, the control engine 1129 can receive moisture readings from a sensor 1139 disposed within the desiccant (e.g., desiccant 625). When these moisture readings fall outside a range of acceptable values (part of the stored data 1154), the control engine 1129 can notify the user 1197 that the desiccant needs to be changed, and the control engine 1129 can also operate one or more components (e.g., the air moving device 1140, the dehumidifier 1159) of the moisture control system 1190 to reduce moisture levels until the desiccant is replaced.

The control engine 1129 can provide control, communication, and/or other similar signals to the user 1197 and/or the network manager 1196. Similarly, the control engine 1129 can receive control, communication, and/or other similar signals from the user 1197 and/or the network manager 1196. The control engine 1129 can control the moisture control system 1190 automatically (for example, based on one or more algorithms 1153 and/or protocols 1152 stored in the storage repository 1151) and/or based on control, communication, and/or other similar signals received from a controller (e.g., the network manager 1196) of another component of the system 1101 through the communication links 1122. The control engine 1129 may include a printed circuit board, upon which the hardware processor 1121 and/or one or more discrete components of the controller 1150 can be positioned.

In certain example embodiments, the control engine 1129 can include an interface that enables the control engine 1129 to communicate with one or more components (e.g., communication module 1138) of the electrical enclosure 1100 and/or another component (e.g., the user 1197, the network manager 1196) of the system 1101. Such an interface can operate in conjunction with, or independently of, the protocols 1152 used to communicate between the controller 1150, the user 1197, and/or the network manager 1196.

The control engine 1129 can operate in real time. In other words, the control engine 1129 of the controller 1150 can process, send, and/or receive communications with the user 1197 and the network manager 1196 as any changes (e.g., discrete, continuous) occur within the system 1101. Further, the control engine 1129 of the controller 1150 can, at substantially the same time, control the moisture control system 1190 (including, for example, a sensor 1139, the air moving device 1145, the dehumidifier 1159, the heating element 1135), the power supply 1169, and the network manager 1196 based on such changes. In addition, the control engine 1129 of the controller 1150 can perform one or more of its functions continuously. For example, the controller 1150 can continuously use and update protocols 1152 and/or algorithms 1153. As another example, the controller 1150 can continuously control the power supply 1169 of the electrical enclosure 1100. In such a case, any updates or changes can be used by the controller 1150 in adjusting a component of the moisture control system 1190 in real time.

The control engine 1129 (or other components of the controller 1150) can also include one or more hardware and/or software architecture components to perform its functions. Such components can include, but are not limited to, a universal asynchronous receiver/transmitter (UART), a universal synchronous receiver/transmitter (USRT), a serial peripheral interface (SPI), a direct-attached capacity (DAC) storage device, an analog-to-digital converter, an inter-integrated circuit ($I^2C$), and a pulse width modulator (PWM).

In certain example embodiments, the communication module 1138 of the controller 1150 determines and implements the communication protocol (e.g., from the protocols 1152 of the storage repository 1151) that is used when the control engine 1129 communicates with (e.g., sends signals to, receives signals from) the user 1197 and/or the network manager 1196. In some cases, the communication module 1138 accesses the protocols 1152 and/or the algorithms 1153 to determine which communication protocol is within the capability of the recipient of a communication sent by the control engine 1129. In addition, the communication module 1138 can interpret the communication protocol of a communication received by the controller 1150 so that the control engine 1129 can interpret the communication.

The communication module 1138 can send data directly to and/or retrieve data directly from the storage repository 1151. Alternatively, the control engine 1129 can facilitate the transfer of data between the communication module 1138 and the storage repository 1151. The communication module 1138 can also provide encryption to data that is sent by the controller 1150 and decryption to data that is received by the controller 1150. The communication module 1138 can also provide one or more of a number of other services with respect to data sent from and received by the controller 1150. Such services can include, but are not limited to, data packet routing information and procedures to follow in the event of data interruption.

The timer 1141 of the controller 1150 can track clock time, intervals of time, an amount of time, and/or any other measure of time. The timer 1141 can also count the number of occurrences of an event, whether with or without respect to time. Alternatively, the control engine 1129 can perform the counting function. The timer 1141 is able to track multiple time measurements concurrently. The timer 1141 can track time periods based on an instruction received from the control engine 1129, based on an instruction received from the user 1197, based on an instruction programmed in the software for the controller 1150, based on some other condition or from some other component, or from any combination thereof.

The timer 1141 can be configured to track time when there is no power delivered to the controller 1150 (e.g., the power module 1148 malfunctions) using, for example, a super capacitor or a battery backup. In such a case, when there is a resumption of power delivery to the controller 1150, the timer 1141 can communicate any aspect of time to the controller 1150. In such a case, the timer 1141 can include one or more of a number of components (e.g., a super capacitor, an integrated circuit) to perform these functions.

The metering module 1144 (also called an energy metering module 1144) of the controller 1150 measures one or more components of energy (e.g., current, voltage, resistance, VARs, watts, gas flow, gas pressure) associated with the electrical enclosure 1100 (including the power supply 1169 and the enclosure components 1110) at one or more points in the system 1101. The metering module 1144 can include any of a number of measuring devices and related devices, including but not limited to a voltmeter, an ammeter, a power meter, an ohmmeter, a current transformer, a potential transformer, a flow meter, a pressure meter, and electrical wiring. The metering module 1144 can measure a component of energy continuously, periodically, based on the occurrence of an event, based on a command received from the control engine 1129, based on measurements captured by the sensors 1139, and/or based on some other factor.

The power module 1148 of the controller 1150 provides power to one or more other components (e.g., timer 1141, control engine 1129) of the controller 1150. In certain example embodiments, the power module 1148 receives power from the power supply 1169. The power module 1148 can include one or more of a number of single or multiple discrete components (e.g., transistor, diode, resistor), and/or a microprocessor. The power module 1148 may include a printed circuit board, upon which the microprocessor and/or one or more discrete components are positioned. In some cases, the power module 1148 can include one or more components that allow the power module 1148 to measure one or more elements of power (e.g., voltage, current) that is delivered to and/or sent from the power module 1148, The power module 1148 can include one or more components (e.g., a transformer, a diode bridge, an inverter, a converter) that receives power (for example, through an electrical cable) from a source (e.g., the power supply 1169) and generates power of a type (e.g., alternating current, direct current) and level (e.g., 12V, 24V, 120V) that can be used by the other components of the controller 1150. The power module 1148 can use a closed control loop to maintain a preconfigured voltage or current with a tight tolerance at the output. The power module 1148 can also protect the rest of the electronics (e.g., hardware processor 1121, transceiver 1142) from surges generated in the line. In addition, or in the alternative, the power module 1148 can be a source of power in itself to provide signals to the other components of the controller 1150. For example, the power module 1148 can be a battery. As another example, the power module 1148 can be a localized photovoltaic power system.

The hardware processor 1121 of the controller 1150 executes software in accordance with one or more example embodiments. Specifically, the hardware processor 1121 can execute software on the control engine 1129 or any other portion of the controller 1150, as well as software used by the user 1197 and/or the network manager 1196. The hardware processor 1121 can be an integrated circuit, a central processing unit, a multi-core processing chip, a multi-chip module including multiple multi-core processing chips, or other hardware processor in one or more example embodiments. The hardware processor 1121 is known by other names, including but not limited to a computer processor, a microprocessor, and a multi-core processor.

In one or more example embodiments, the hardware processor 1121 executes software instructions stored in memory 1146. The memory 1146 includes one or more cache memories, main memory, and/or any other suitable type of memory. The memory 1146 is discretely located within the controller 1150 relative to the hardware processor 1121 according to some example embodiments. In certain configurations, the memory 1146 can be integrated with the hardware processor 1121.

In certain example embodiments, the controller 1150 does not include a hardware processor 1121. In such a case, the controller 1150 can include, as an example, one or more field programmable gate arrays (FPGAs), one or more integrated-gate bipolar transistors (IGBTs), and/or one or more integrated circuits (ICs). Using FPGAs, IGBTs, ICs, and/or other similar devices known in the art allows the controller 224 (or portions thereof) to be programmable and function according to certain logic rules and thresholds without the use of a hardware processor. Alternatively, FPGAs, IGBTs, ICs, and/or similar devices can be used in conjunction with one or more hardware processors 221.

The transceiver 1142 of the controller 1150 can send and/or receive control and/or communication signals. Specifically, the transceiver 1142 can be used to transfer data between the controller 1150, the user 1197, and the network manager 1196. The transceiver 1142 can use wired and/or wireless technology. The transceiver 1142 can be configured in such a way that the control and/or communication signals sent and/or received by the transceiver 1142 can be received and/or sent by another transceiver that is part of the user 1197 and/or the network manager 1196.

When the transceiver 1142 uses wireless technology as the communication link 1122, any type of wireless technology can be used by the transceiver 1142 in sending and receiving signals. Such wireless technology can include, but is not limited to, Wi-Fi, visible light communication, cellular networking, and Bluetooth. The transceiver 1142 can use one or more of any number of suitable communication protocols (e.g., ISA100) when sending and/or receiving signals. Such communication protocols can be dictated by the communication module 1138. Further, any transceiver information for the user 1197 and/or the network manager 1196 can be stored in the storage repository 1151.

Optionally, in one or more example embodiments, the security module 1147 secures interactions between the controller 1150, the user 1197, and the network manager 1196. More specifically, the security module 1147 authenticates communication from software based on security keys verifying the identity of the source of the communication. For example, user software may be associated with a security key enabling the software of the user 1197 to interact with the controller 1150 and/or the network manager 1196. Further, the security module 1147 can restrict receipt of information, requests for information, and/or access to information in some example embodiments.

Figure 12:
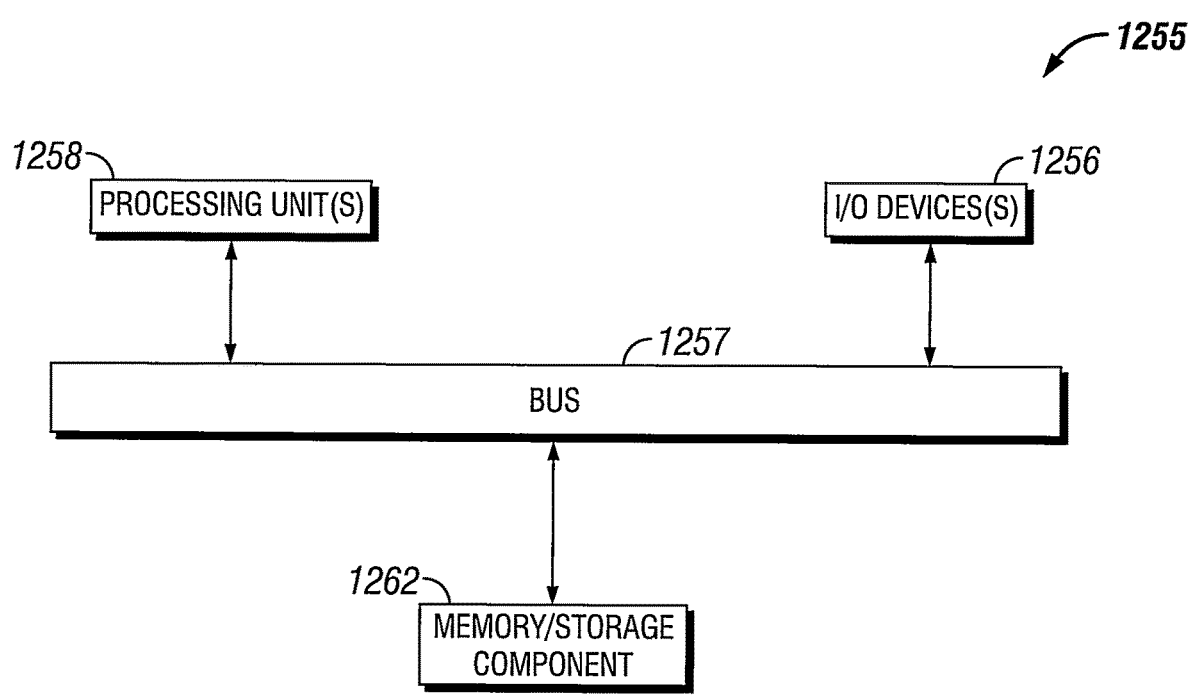
FIG. 12 shows a computing device in accordance with one or more example embodiments.

One or more of the functions performed by any of the components (e.g., controller 1150) of an example moisture control system 1190 can be performed using a computing device 1558. FIG. 12 shows a computing device 1255 in accordance with one or more example embodiments. The computing device 1558 implements one or more of the various techniques described herein, and which is representative, in whole or in part, of the elements described herein pursuant to certain example embodiments. Computing device 1558 is one example of a computing device and is not intended to suggest any limitation as to scope of use or functionality of the computing device and/or its possible architectures. Neither should computing device 1558 be interpreted as having any dependency or requirement relating to any one or combination of components illustrated in the example computing device 1558.

Computing device 1558 includes one or more processors or processing units 1554, one or more memory/storage components 1555, one or more input/output (I/O) devices 1556, and a bus 1557 that allows the various components and devices to communicate with one another. Bus 1557 represents one or more of any of several types of bus structures, including a memory bus or memory controller, a peripheral bus, an accelerated graphics port, and a processor or local bus using any of a variety of bus architectures. Bus 1557 includes wired and/or wireless buses.

Memory/storage component 1555 represents one or more computer storage media. Memory/storage component 1555 includes volatile media (such as random access memory (RAM)) and/or nonvolatile media (such as read only memory (ROM), flash memory, optical disks, magnetic disks, and so forth). Memory/storage component 1555 includes fixed media (e.g., RAM, ROM, a fixed hard drive, etc.) as well as removable media (e.g., a Flash memory drive, a removable hard drive, an optical disk, and so forth).

One or more I/O devices 1556 allow a customer, utility, or other user to enter commands and information to computing device 1558, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card.

Various techniques are described herein in the general context of software or program modules. Generally, software includes routines, programs, objects, components, data structures, and so forth that perform particular tasks or implement particular abstract data types. An implementation of these modules and techniques are stored on or transmitted across some form of computer readable media. Computer readable media is any available non-transitory medium or non-transitory media that is accessible by a computing device. By way of example, and not limitation, computer readable media includes "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which is used to store the desired information and which is accessible by a computer.

The computer device 1558 is connected to a network (not shown) (e.g., a local area network (LAN), a wide area network (WAN) such as the Internet, or any other similar type of network) via a network interface connection (not shown) according to some example embodiments. Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means take other forms, now known or later developed, in other example embodiments. Generally speaking, the computer system 1558 includes at least the minimal processing, input, and/or output means necessary to practice one or more embodiments.

Further, those skilled in the art will appreciate that one or more elements of the aforementioned computer device 1558 is located at a remote location and connected to the other elements over a network in certain example embodiments. Further, one or more embodiments is implemented on a distributed system having one or more nodes, where each portion of the implementation (e.g., controller 1150) is located on a different node within the distributed system. In one or more embodiments, the node corresponds to a computer system. Alternatively, the node corresponds to a processor with associated physical memory in some example embodiments. The node alternatively corresponds to a processor with shared memory and/or resources in some example embodiments.

Example embodiments provide for moisture control systems for enclosures. Specifically, certain example embodiments allow for a variety of systems that control one or more conditions (e.g., moisture, temperature) within an enclosure. Example moisture control systems for enclosures allow the climate within the cavity of an enclosure to be regulated. For example, example moisture control systems can reduce moisture within a cavity of an enclosure. Example embodiments can allow an enclosure to comply with applicable standards (e.g., NEMA 4×enclosure, NEMA 7 enclosure) and/or regulations. In some cases, example embodiments can operate automatically and can provide predictive maintenance scheduling assistance. In some cases, example moisture control systems can operate without electricity. In addition, certain example embodiments can be maintained without opening an enclosure.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. An enclosure system comprising:
   an enclosure comprising at least one wall forming a first cavity; and
   a moisture control system in communication with the enclosure, wherein the moisture control system controls at least one condition within the cavity of the enclosure, wherein the at least one condition affects an amount of moisture within the first cavity,
   wherein a portion of the moisture control system penetrates the at least one wall of the enclosure to form a flame path therebetween, wherein the flame path is a gap between the at least one wall and the portion of the moisture control system, wherein the flame path is narrow enough to contain an explosion that originates within the first cavity, and wherein the flame path is wide enough to allow gases from within the first cavity to escape and cool as the gases leave the first cavity.

2. The enclosure system of claim 1, wherein the moisture control system comprises:
   a desiccant vessel that contains desiccant, wherein the desiccant vessel is disposed in the first cavity of the enclosure;
   a heating element in contact with the desiccant vessel; and
   a power source electrically coupled to the heating element, wherein the power source provides power to the heating element,
   wherein the heating element, when receiving the power, generates heat that is transferred to the desiccant within the container.

3. The enclosure system of claim 2, wherein the power source comprises a main source of power and an energy storage device, wherein the energy storage device provides reserve power to the heating element when the main source of power ceases to provide primary power to the heating element.

4. The enclosure system of claim 3, wherein the energy storage device is charged by the main source of power.

5. The enclosure system of claim 2, wherein the moisture control system further comprises:
   an air moving device electrically coupled to the power source.

6. The enclosure system of claim 2, wherein the moisture control system further comprises:
   a sensor device disposed within the desiccant, wherein the sensor device measures an amount of moisture in the desiccant.

7. The enclosure system of claim 6, wherein the moisture control system further comprises:
   a controller coupled to the power source and the sensor device.

8. The enclosure system of claim 1, wherein the moisture control system comprises:
   a structural filter disposed, in part, in the first cavity of the enclosure, wherein the structural filter traverses an enclosure wall of the enclosure, wherein the structural filter comprises a body that forms a second cavity; and
   a desiccant vessel that is removably coupled to and disposed within the second cavity of the body of the structural filter, wherein the desiccant vessel is accessible by a user from outside the enclosure.

9. The enclosure system of claim 8, wherein the desiccant vessel comprises a base, wherein the base comprises mating threads that are threadably coupled to complementary mating threads disposed on the structural filter.

10. The enclosure system of claim 1, wherein the moisture control system comprises:
    a breather disposed in an enclosure wall of the enclosure, wherein the breather comprises a proximal end and a distal end, wherein the proximal end of the breather is disposed adjacent to the first cavity of the enclosure, and wherein the distal end of the breather is disposed, at least in part, in the enclosure wall of the enclosure; and
    a desiccant vessel that is removably coupled to the enclosure, wherein the desiccant vessel is disposed adjacent to the distal portion of the breather, wherein the desiccant vessel is accessible by a user from outside the enclosure.

11. The enclosure system of claim 10, wherein the desiccant vessel comprises a base, wherein the base comprises mating threads that are threadably coupled to complementary mating threads disposed in the enclosure wall of the enclosure.

12. The enclosure system of claim 10, wherein the desiccant vessel comprises a body, wherein the body comprises a material that allows a user to see a color of the desiccant, wherein the desiccant changes color based on a moisture content of the desiccant.

13. An enclosure system comprising:
   an enclosure comprising at least one wall forming a cavity; and
   a moisture control system in communication with the enclosure, wherein the moisture control system comprises:
      a moisture control device disposed, at least in part, within the cavity of the enclosure, wherein the moisture control device comprises a desiccant vessel disposed within the cavity;
      a sensor that measures a parameter associated with an effectiveness of the moisture control device;
      a heating element wrapped around an outer surface of the desiccant vessel;
      a power source electrically coupled to the heating element, wherein the power source provides power to the heating element; and
      a controller that receives measurements made by the sensor and determines whether the effectiveness of the moisture control device has been compromised based on the measurements,
   wherein the controller instructs the power source to provide power to the heating element when the measurements made by the sensor indicate that the effectiveness of the moisture control device has been compromised, and
   wherein a portion of the moisture control system penetrates the at least one wall of the enclosure to form a flame path therebetween, wherein the flame path is a gap between the at least one wall and the portion of the moisture control system, wherein the flame path is narrow enough to contain an explosion that originates within the first cavity, and wherein the flame path is wide enough to allow gases from within the first cavity to escape and cool as the gases leave the first cavity.

14. The enclosure system of claim 13, wherein the parameter measured by the sensor is an amount of moisture in the desiccant disposed within the desiccant vessel, and wherein the controller determines whether the amount of moisture falls outside a range of acceptable values.

15. The enclosure system of claim 14, wherein the sensor is disposed within the desiccant.

16. An enclosure system comprising:
   an enclosure comprising at least one wall forming a first cavity; and
   at least one moisture control system in communication with the enclosure, wherein the at least one moisture control system controls at least one condition within the first cavity of the enclosure, wherein the at least one moisture control system comprises:
      a structural filter defining a portion of the first cavity of the enclosure, wherein the structural filter traverses at least part of an aperture that traverses the at least one wall of the enclosure; and
      a desiccant vessel that is removably in communication with the structural filter, wherein the desiccant vessel is accessible by a user from outside the enclosure while the enclosure is in a closed position,
   wherein the structural filter remains fixedly coupled to the at least one wall of the enclosure when the desiccant vessel is decoupled from the structural filter.

17. The enclosure system of claim 16, wherein the desiccant vessel comprises a base, wherein the base comprises mating threads that are threadably coupled to complementary mating threads disposed on the structural filter.

18. The enclosure system of claim 16, wherein the desiccant vessel abuts against the structural filter within the aperture in the at least one wall of the enclosure, wherein the desiccant vessel comprises a base, wherein the base comprises mating threads that are threadably coupled to complementary mating threads disposed on the at least one wall of the enclosure forming the aperture.

* * * * *